United States Patent [19]

Kimura

[11] Patent Number: 6,046,504
[45] Date of Patent: Apr. 4, 2000

[54] RESIN-ENCAPSULATED LOC SEMICONDUCTOR DEVICE HAVING A THIN INNER LEAD

[75] Inventor: Noriyuki Kimura, Tateyama, Japan

[73] Assignee: Nippon Steel Corporation, Tokyo, Japan

[21] Appl. No.: 09/024,650

[22] Filed: Feb. 17, 1998

[30] Foreign Application Priority Data

Feb. 17, 1997 [JP] Japan ..................................... 9-046920

[51] Int. Cl.[7] .......................... H01L 23/48; H01L 23/495; H01L 23/52
[52] U.S. Cl. ............................ 257/775; 257/668; 257/691
[58] Field of Search ..................... 257/668, 775, 257/691

[56] References Cited

U.S. PATENT DOCUMENTS

| | | | |
|---|---|---|---|
| 4,810,620 | 3/1989 | Takiar et al. | 430/314 |
| 5,796,158 | 8/1998 | King | 257/666 |
| 5,834,831 | 11/1998 | Kubota et al. | 257/674 |
| 5,859,471 | 1/1999 | Kuraishi et al. | 257/666 |

FOREIGN PATENT DOCUMENTS 4-291950 of 1992 Japan.

*Primary Examiner*—Teresa M. Arroyo
*Attorney, Agent, or Firm*—Pollock, Vande Sande & Amernick

[57] ABSTRACT

A semiconductor device of the present invention has an LOC (Lead On Chip) structure. An end portion of an inner lead made thinner than an outer lead by cutting its lower surface by a predetermined thickness and a bus bar thinned to have the same thickness as the end portion of the inner lead are bonded to the surface of a semiconductor chip on which circuits are formed, with a protective film and an insulating tape interposed therebetween. A bonding wire is bonded to the thin portion of the inner lead or the thin bus bar. The thickness from the upper surface of the semiconductor chip to the upper surface of the inner lead can be reduced by the cut portion. A thin package can be realized without deteriorating the reliability with the normal thickness of the outer lead, the insulating tape and an encapsulating resin and the normal loop height of the bonding wire.

24 Claims, 15 Drawing Sheets

RESIN-ENCAPSULATED LOC SEMICONDUCTOR DEVICE HAVING A THIN INNER LEAD

BACKGROUND OF THE INVENTION

1. Field of the Invention

The present invention relates to a semiconductor integrated circuit device and, more particularly, to a technique suitably applicable to a resin-encapsulated LSI package (TSOP: Thin Small Outline Package) having an LOC (Lead On Chip) structure of a large scale integrated circuit.

2. Description of the Related Art

Demands on information and communication apparatuses are increasing yearly in the recent information age. Of these information and communication apparatuses, portable information apparatuses particularly increasingly demanded, such as a camcorder, a PHS (Personal Handyphone System), and a notebook personal computer, tend to be made entirely smaller and thinner to improve the portability. Accordingly, LSI packages incorporated into these apparatuses are naturally required to be made smaller and thinner.

Meanwhile, as the large scale integration of semiconductor elements advances, the chip area of a semiconductor gradually increases. Consequently, it becomes difficult to accommodate semiconductor elements in a package with required dimensions in a packaging method by which a chip is die-bonded to the die pad of a lead frame.

To eliminate this difficulty, LOC TSOPs such as described in Japanese Patent Laid-Open No. 4-291950 have been proposed and put into practical use.

FIG. 13A is a plan view schematically showing a representative TSOP having an LOC sturcture before resin encapsulation. FIG. 13B is a sectional view showing the representative TSOP after resin encapsulation taken along a line D–D' in FIG. 13A. The structure of this TSOP will be described below in order of its manufacturing steps. First, one surface of insulating tape 3 is bonded to the lower surfaces of inner leads 2 in a lead frame 10 comprising the inner leads 2, outer leads 12, tiebars 13 and a base portion 14. The other surface of the insulating tape 3 bonded to the lead frame 10 is bonded to a predetermined position of the surface of a semiconductor chip 4 in a central portion of which bonding pads 1 are formed. The bonding pads 1 on the semiconductor chip 4 are electrically connected to the inner leads 2 by bonding wires 5. Subsequently, the semiconductor chip 4 is entirely encapsulated with an encapsulating resin 7 by transfer molding. The tiebars 13 and the base portion 14 in the lead frame 10 are cut and the leads are formed into a desired shape, thereby completing the TSOP.

The TSOP thus formed can be made small because a dimension in particularly the lateral direction can be reduced as compared with a package in which wire bonding is performed to inner leads arranged outside a semiconductor chip.

It is predicted that demands on thin reliable TSOPs having a thickness of 1 mm or less will increase in the future with the spread of IC cards and the like. A TSOP having the conventional LOC structure as described above can be made thinner by the following techniques:

(1) lowering the loop of a bonding wire (lowering the locus of a bonding wire from the surface of a semiconductor chip);

(2) reducing the thickness of a semiconductor chip;

(3) reducing the thickness of a frame;

(4) reducing the thickness of an insulating tape, or (5) reducing the thickness of an encapsulating resin.

When a package is thinned by any of the above techniques, however, a TSOP having the conventional LOC structure poses the following problems.

When a package is thinned by (1) lowering the loop of a bonding wire, variations in the loop height increase the probability of contact of a bonding wire with an inner lead or a bus bar. This increases the possibility of production of defective devices.

When a package is thinned by (2) reducing the thickness of a semiconductor chip, it is necessary to increase the polishing amount of the rear surface of a semiconductor wafer in a back grinding step before the wafer is cut into chips. However, it is inevitable to further increase the wafer diameter in the future for the purpose of improving the productivity. As the diameter is increased, the warp of a wafer resulting from the stress of various films deposited on the wafer in the process of manufacturing a semiconductor circuit increases. When the rear surface of a wafer having this large warp is polished, the semiconductor chip thickness in the center of the wafer becomes different from that in the edge of the wafer. To prevent this, it is necessary to perform polishing after the rear surface of the wafer is forcibly flattened by vacuum suction or the like. However, this method is unpreferable because the wafer can be broken. Also, it is unpreferable to perform back grinding after semiconductor chips are cut out because this extends the period of the manufacturing process.

When a package is thinned by (3) reducing the thickness of a frame, the strength of a lead frame material decreases. This increases the possibility of a break of the frame when outer leads are formed into a predetermined shape or the package is incorporated into an electronic apparatus, resulting in low reliability.

When a package is thinned by (4) reducing the thickness of an insulating tape, the capacitance between a lead frame and a semiconductor chip increase excessively or the resistance against an external stress to the semiconductor chip decreases. In the worst case, the semiconductor chip cracks. This deteriorates the electrical characteristics and the reliability.

When a package is thinned by (5) reducing the thickness of an encapsulating resin, the thickness of the package has its limit of thinning because a certain encapsulating resin thickness is necessary on the upper surface of a semiconductor chip to ensure a region for passing bonding wires. Therefore, it is necessary to reduce the encapsulating resin thickness on the lower surface (rear surface) of the chip. On the other hand, the warp of a package results from the difference between the shrinkage forces (ratios) of encapsulating resins on the two sides of a semiconductor chip, and this shrinkage force difference depends upon the volume ratio of the encapsulating resins. Accordingly, when the thickness of the encapsulating resin on the lower surface of the chip is reduced, the encapsulating resin volume on the lower surface of the chip becomes smaller than that on the upper surface, and this warps the package.

SUMMARY OF THE INVENTION

It is an object of the present invention to realize a thin resin-encapsulated LSI package (TSOP) in a semiconductor device having an LOC structure without deteriorating the reliability.

It is another object of the present invention to reduce the thickness of a resin-encapsulated LSI package (TSOP) in a semiconductor device having an LOC structure without deteriorating the reliability.

According to an aspect of the present invention, there is provided a resin-encapsulated semiconductor device comprising a semiconductor chip on which circuits are formed, bonding pads formed on the semiconductor chip, outer leads for connecting external terminals, inner leads connected to the outer leads, an insulating tape for electrically insulating the inner leads from the semiconductor chip, the inner leads bonded to a circuit formation surface of the semiconductor chip with the insulating tape interposed therebetween, and bonding wires electrically connecting the inner leads and bonding pads, wherein a thickness of at least a portion in contact with the insulating tape in the inner lead is smaller than a thickness of the outer lead.

According to another aspect of the present invention, there is provided a resin-encapsulated semiconductor device comprising a semiconductor chip on which circuits are formed, bonding pads formed on the semiconductor chip, inner leads, an insulating tape for electrically insulating the inner leads from the semiconductor chip, the inner leads bonded to a circuit formation surface of the semiconductor chip with the insulating tape interposed therebetween, and bonding wires electrically connecting the inner leads and bonding pads, wherein a lower surface of an end portion of the inner lead is partially removed to form a notched portion, and one surface of the insulating tape is bonded to at least a part of the notched portion of the inner lead and the other surface of the insulating tape is bonded to an upper surface of the semiconductor chip.

According to still another aspect of the present invention, there is provided a resin-encapsulated semiconductor device comprising a semiconductor chip on which circuits are formed, bonding pads formed on the semiconductor chip, inner leads, an insulating tape for electrically insulating the inner leads from the semiconductor chip, the inner leads bonded to a circuit formation surface of the semiconductor chip with the insulating tape interposed therebetween, and bonding wires electrically connecting the inner leads and bonding pads, wherein a lower surface of the inner lead is partially removed to form a recessed portion, and one surface of the insulating tape is bonded to at least a part of an inner surface of the recessed portion of the inner lead and the other surface of the insulating tape is bonded to an upper surface of the semiconductor chip.

According to still another aspect of the present invention, there is provided a resin-encapsulated semiconductor device comprising a semiconductor chip on which circuits are formed, bonding pads formed on the semiconductor chip, outer leads for connecting external terminals, inner leads connected to the outer leads, an insulating tape for electrically insulating the inner leads from the semiconductor chip, the inner leads bonded to a circuit formation surface of the semiconductor chip with the insulating tape interposed therebetween, and bonding wires electrically connecting the inner leads and bonding pads, wherein an end portion of the inner lead is thinner than the outer lead and offset downwardly from a portion connected to the outer lead in the inner lead, and one surface of the insulating tape is bonded to at least a part of a lower surface of the end portion of the inner lead and the other surface of the insulating tape is bonded to an upper surface of the semiconductor chip.

According to still another aspect of the present invention, there is provided a resin-encapsulated semiconductor device comprising a semiconductor chip on which circuits are formed, bonding pads formed on the semiconductor chip, outer leads for connecting external terminals, inner leads connected to the outer leads, an insulating tape for electrically insulating the inner leads from the semiconductor chip, the inner leads bonded to a circuit formation surface of the semiconductor chip with the insulating tape interposed therebetween, and bonding wires electrically connecting the inner leads and bonding pads, wherein an end portion of the inner lead is offset downwardly from a portion connected to the outer lead in the inner lead and a lower surface of the offset end portion of the inner lead is partially removed to form a notched portion, and one surface of the insulating tape is bonded to at least a part of the notched portion of the inner lead and the other surface of the insulating tape is bonded to an upper surface of the semiconductor chip.

According to still another aspect of the present invention, there is provided a resin-encapsulated semiconductor device comprising a semiconductor chip on which circuits are formed, bonding pads formed on the semiconductor chip, outer leads for connecting external terminals, inner leads connected to the outer leads, an insulating tape for electrically insulating the inner leads from the semiconductor chip, the inner leads bonded to a circuit formation surface of the semiconductor chip with the insulating tape interposed therebetween, and bonding wires electrically connecting the inner leads and bonding pads, wherein an end portion of the inner lead is offset downwardly from a portion connected to the outer lead in the inner lead and a lower surface of the offset end portion of the inner lead is partially removed to form a recessed portion, and one surface of the insulating tape is bonded to at least a part of an inner surface of the recessed portion of the inner lead and the other surface of the insulating tape is bonded to an upper surface of the semiconductor chip.

Preferably, the device further comprises a bus bar connecting two arbitrary ones of the inner leads and extended along end portions of the other inner leads, wherein a thickness of at least a portion in contact with the insulating tape in the bus bar is substantially equal to a thickness of the portion thinner than the outer lead in the inner lead.

Preferably, a portion for pressing and bonding the bonding wire is formed on an upper surface of the portion thinner than the outer lead in the inner lead.

Preferably, the bonding wire passes over at least the portion thinner than the outer lead in the bus bar.

Preferably, the recessed portion is formed in at least a portion positioned above the semiconductor chip in the inner lead.

Accordingly, the thickness of the package can be reduced because of the thinned portion, e.g., the end portion of the inner lead.

In the present invention, the lower surface of an end portion of an inner lead and a bus bar, which are bonded to a semiconductor chip with a protective film and an insulating tape interposed therebetween, are removed by a predetermined thickness in advance. Therefore, it is unnecessary to reduce the thicknesses of an outer lead, an insulating tape, an encapsulating resin, and a semiconductor chip itself or to reduce the loop height of a bonding wire, any of which has a large influence on the reliability. Accordingly, a thin package can be realized by only adding the step of forming a thin portion without deteriorating the reliability.

DETAILED DESCRIPTION OF THE PREFERRED EMBODIMENTS

Several embodiments of a semiconductor device having an LOC structure according to the present invention and a method of manufacturing the same will be described below in detail with reference to the accompanying drawings.

First Embodiment

Figure 1A:
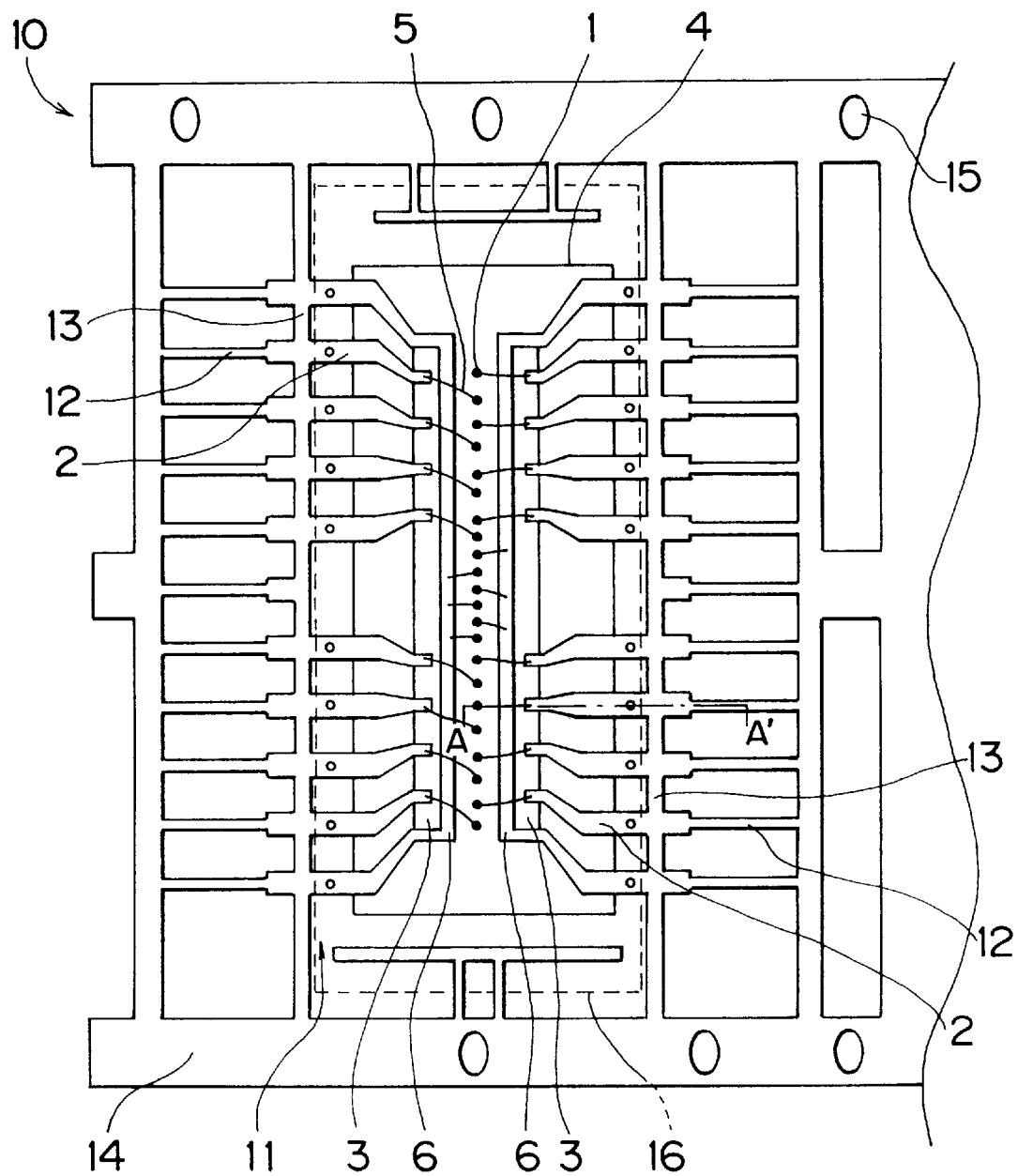
FIG. 1A is a schematic plan view showing a resin-encapsulated semiconductor device according to the first and second embodiments of the present invention before resin encapsulation.

The first embodiment will be described below. The schematic arrangement of this semiconductor device will be described first. FIG. 1A is a plan view schematically showing the semiconductor device before resin encapsulation.

Figure 1B:
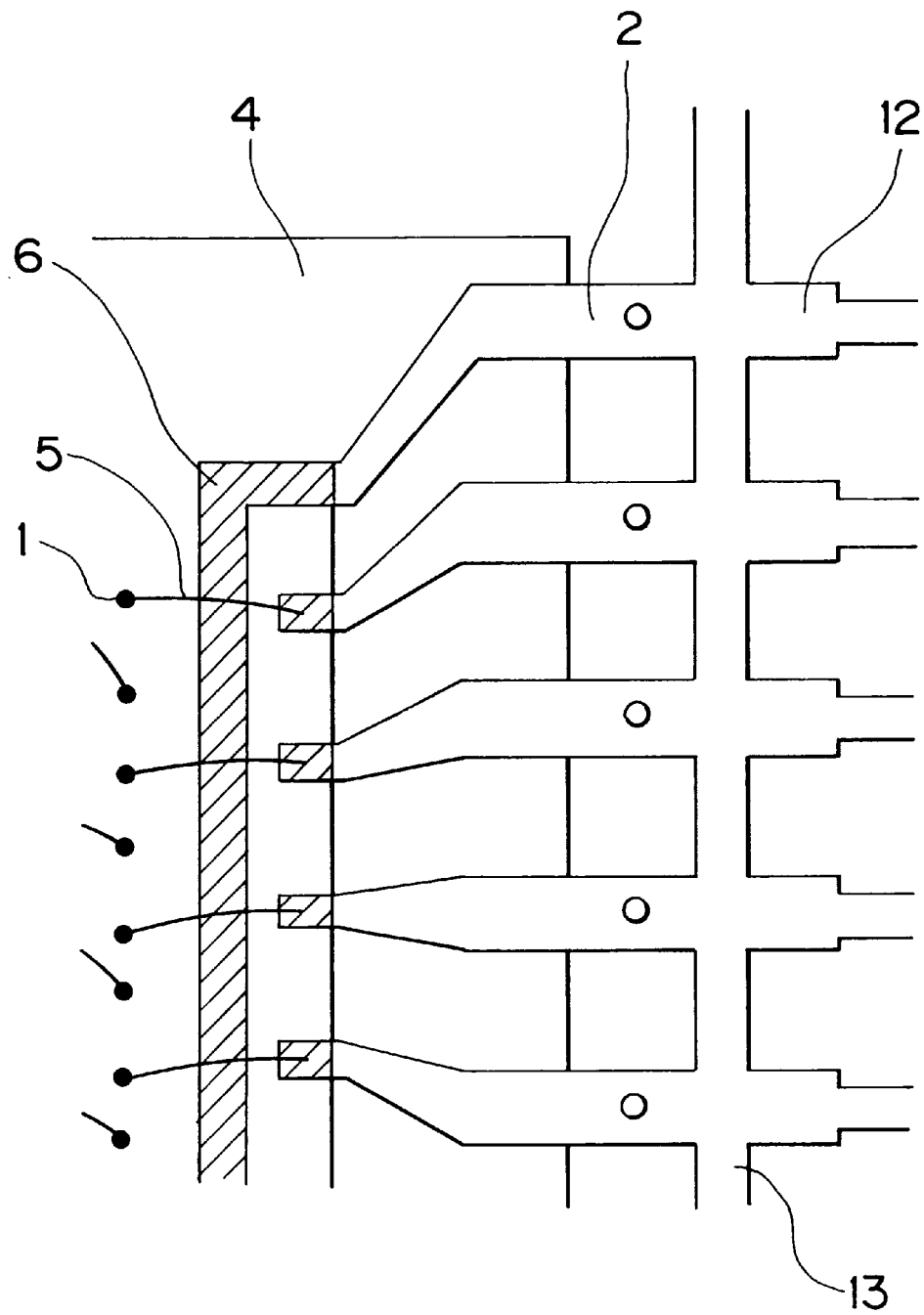
FIG. 1B is an enlarged schematic plan view showing some inner leads and a part of a bus bar in FIG. 1A of the semiconductor device of the first embodiment.
Figure 2A:
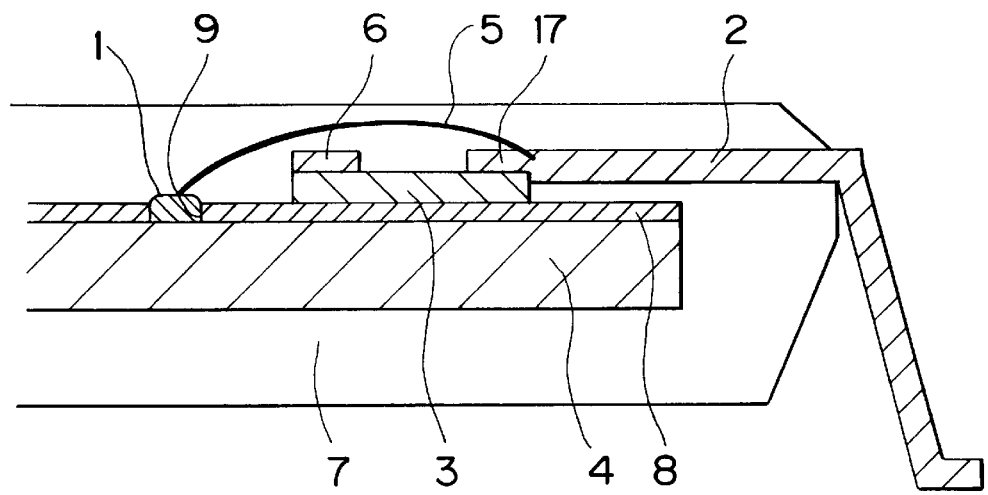
FIG. 2A is a schematic sectional view showing the semiconductor device of the first embodiment after resin encapsulation taken along a line A–A' in FIG. 1A.
Figure 2B:
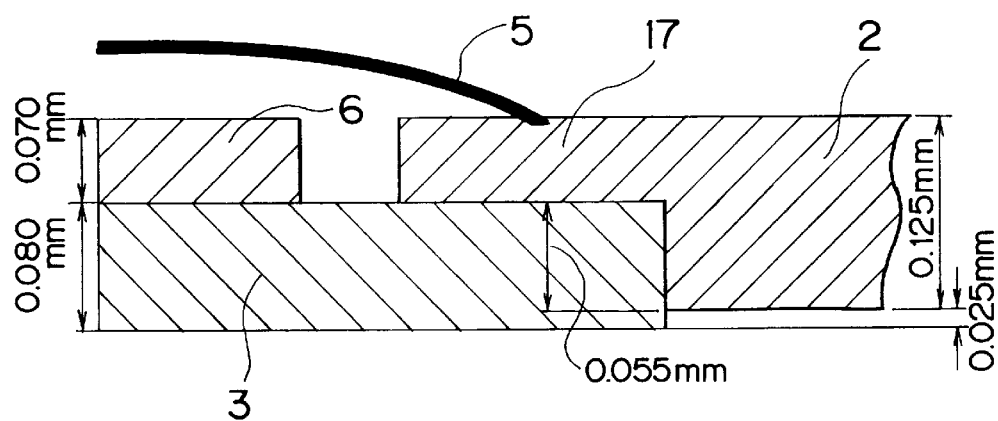
FIG. 2B is an enlarged schematic sectional view showing an insulating tape and its neighborhood in FIG. 2A of the semiconductor device of the first embodiment.

FIG. 1B is an enlarged plan view showing some inner leads in FIG. 1A. FIG. 2A is a sectional view showing the semiconductor device after resin encapsulation taken along line A–A' in FIG. 1A. FIG. 2B is an enlarged sectional view showing an insulating tape and its neighborhood in FIG. 2A.

The semiconductor device of the first embodiment shown in FIG. 1A comprises a semiconductor chip 4 on which semiconductor elements are formed (in this case, a DRAM is exemplified as the semiconductor elements) and a lead frame 10 fixed to the semiconductor chip 4.

On the semiconductor chip 4, a plurality of memory cells (memory cell regions) each having at least one transistor and capacitor are formed in a matrix, and a plurality of peripheral circuits (peripheral circuit regions) for the memory cells are formed around the memory cells. A protective film 8 for protecting these circuits from α-rays is formed on the surface of the semiconductor chip 4 to cover the memory cell regions and the peripheral circuit regions. A plurality of openings 9 are formed in the protective film 8 to partially expose the surface of the semiconductor chip 4. As shown in FIG. 2A, a bonding pad 1 consisting of a conductive material and electrically conducted to a predetermined portion of the semiconductor chip 4 is formed in each opening 9.

A rectangular device hole 11 is formed in a substantially central portion of the lead frame 10 consisting of alloy 42. The lead frame 10 having the device hole 11 comprises inner leads 2, outer leads 12, tiebars 13, bus bars 6, a base portion 14, and sprocket holes 15. The inner leads 2 are formed so as to substantially symmetrically project from the opposing two sides of the edge of the device hole 11 toward the device hole 11. Each outer lead 12 is connected to the corresponding inner lead 2. Each tiebar 13 is formed so as to cross the boundary portions between the inner leads 2 and the outer leads 12. Each bus bar 6 is formed for a power supply line or a ground line so as to connect the endmost ones of the inner leads 2 arranged on each of the opposing sides of the edge of the device hole 11 and is extended along the distal ends of the other inner leads 2. The base portion 14 supports the tiebars 13. The sprocket holes 15 are formed in the base portion 14 at a predetermined interval. A plurality of lead frames 10 are continuously formed in correspondence to a plurality of semiconductor chips 4. FIG. 1A shows one lead frame 10 corresponding to one semiconductor chip. The thickness of the lead frame 10 is normally about 0.125 mm.

As shown in FIG. 2A, the lower surface of the lead frame 10 is located on the upper surface of the semiconductor chip 4, on which the protective film 8 is formed, so that the bonding pads 1 appear between the opposing bus bars 6. The distal end portions of the inner leads 2 and the lower surfaces of the bus bars 6 are bonded and fixed to the upper surface of the protective film 8 with an insulating tape 3 having a thickness of about 0.08 mm interposed therebetween.

In hatched portions in FIG. 1B of the distal end portions of the inner leads 2 and the bus bar 6, the lower surfaces of these hatched portions which come into contact with the insulating tape 3 are notched into a rectangular shape or cut as shown in FIG. 2B, and each inner lead 2 has a notched portion 17 in its distal end portion. That is, these hatched portions in FIG. 1B are made thinner than the outer leads 12 and the other portions of the inner leads 2.

The notched portion 17 preferably has a length of about 0.3 to 0.4 mm, since the upper surface of the notched portion 17 is used as a pressure bonding region for a bonding wire 5. The thickness of the notched portion 17 and the cut bus bar 6 can be reduced to the processing limit. In this embodiment, the thickness of the notched portion 17 is 0.07 mm to prevent the lead frame 10 from being bent or broken when the lead frame 10 is bonded to the semiconductor chip 4. Also, the thickness of the cut bus bar 6 is equal or nearly equal to that of the notched portion 17 of the inner lead 2. Accordingly, although the height from the upper surface of the protective film 8 to the upper surface of the inner lead 2 is about 0.205 mm in conventional semiconductor devices, this height is about 0.150 mm in the semiconductor device of this embodiment. That is, the height is reduced by 0.055 mm corresponding to the thickness of a piece cut from the distal end portion of the inner lead 2 to form the notched portion 17. Consequently, the thickness of a package can be reduced.

The upper surface of the distal end portion of each inner lead 2 is connected to the bonding pad 1 corresponding to each inner lead 2 by the bonding wire 5 consisting of gold (Au) by what is called wire bonding. The bonding wire 5 may be a copper (Cu) wire, a coated wire formed by coating the surface of a metal wire with an insulating resin, or the like.

The outer leads 12 connected to the inner leads 2 and separated from one another upon cutting the tiebars 13 and are used as a power supply terminal for supplying a power supply voltage to individual circuits constituting a DRAM, a data signal input terminal, a write enable terminal, a row address strobe signal terminal, a column address strobe signal terminal, a data signal output terminal, a reference voltage terminal, a free terminal, and the like.

A resin encapsulation region 16 shown in FIG. 1A is filled with an encapsulating resin 7 by using a mold (not shown), and the all surfaces of the semiconductor chip 4 are covered with the encapsulating resin 7.

Figure 3:
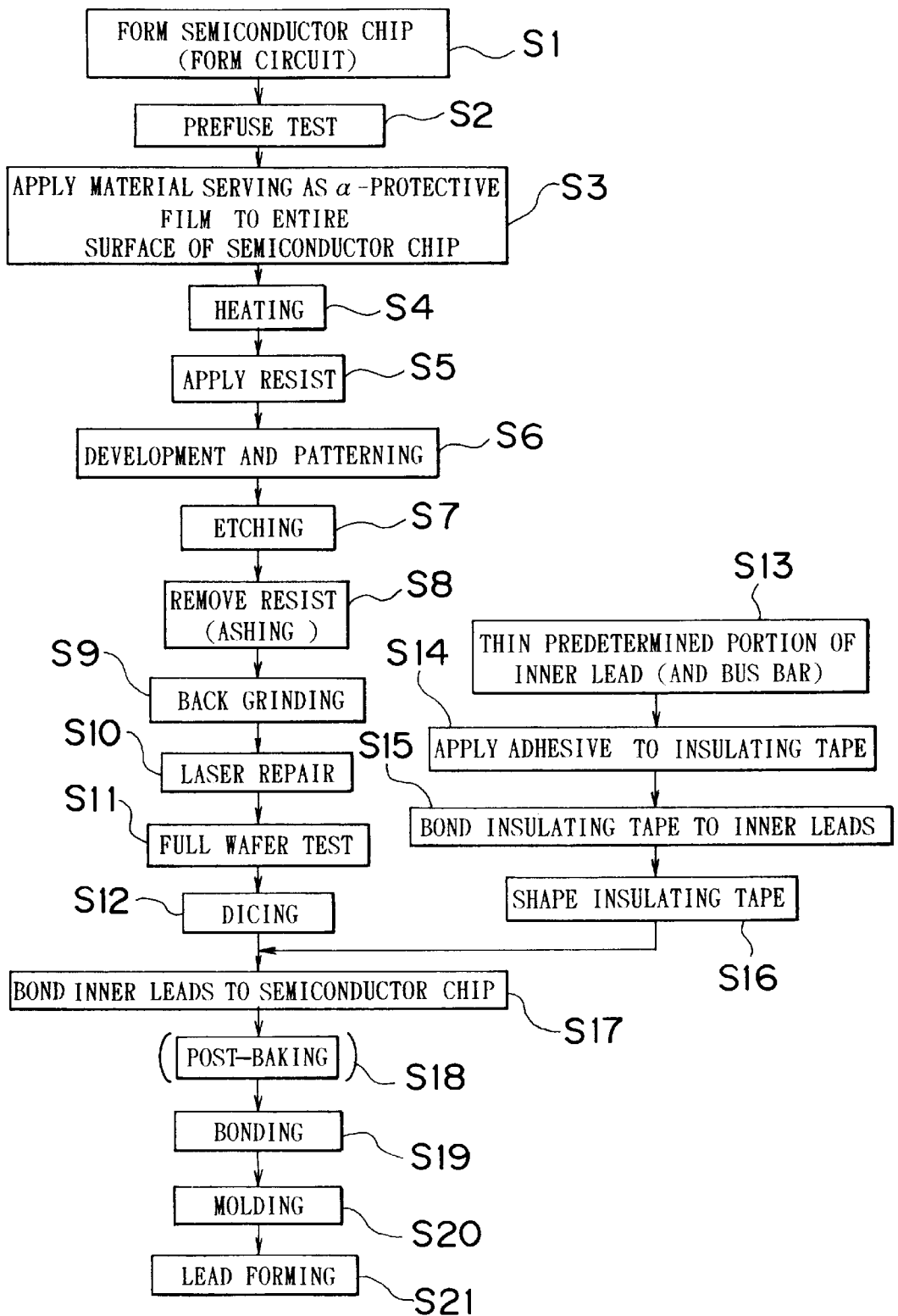
FIG. 3 is a schematic flow chart showing steps of manufacturing the resin-encapsulated semiconductor devices according to the first, second, and third embodiment of the present invention in order of manufacturing steps.

A method of manuafacturing the semiconductor device of the first embodiment will be described below. FIG. 3 is a schematic flow chart showing steps in manufacturing the semiconductor device of this embodiment in order of the manufacturing steps.

First, memory cells and their peripheral circuits are formed on a semiconductor wafer to form a plurality of semiconductor chips 4 on the semiconductor wafer (step S1).

Sebsequently, a pre-fuse test is performed for the semiconductor chips 4 (step S2), and the α-ray protective film 8 is formed on the entire surface of each semiconductor chip 4 (step S3). After the semiconductor wafer is heated to more strongly bond the protective film 8 to the semiconductor wafer (step S4), a resist is applied to the entire surface of the semiconductor wafer (step S5) and normal photolithography is performed (step S6). A plurality of openings 9 are formed in the protective film 8 to expose the bonding pads 1 formed on the semiconductor chip 4 by normal anisotropic etching (step S7). After the resist is removed by ashing (step S8), the thickness of the semiconductor chip 4 is adjusted by back grinding (step S9). Thereafter, laser repair is performed (step S10), and a full wafer test is performed (step S11).

Sebsequently, dicing is performed to cut the semiconductor wafer into the semiconductor chips 4 (step S12). In parallel with the processing in step S12, the following four steps are performed. First, a notched portion 17 is formed in the distal end portion of the inner lead 2, and the lower surface of the bus bar 6 is simultaneously cut so as to have the same thickness as the notched portion 17 (step S13). The formation of the notched portion 17 and the cutting of the lower surface of the bus bar 6 may be performed not only by cutting but also by other techniques for removal and are preferably performed by, e.g., etching, polishing, pressing, or rolling. After an adhesive is applied to the two surfaces of the insulating tape 3 (step S14), one surface of the insulating tape 3 is bonded to the inner leads 2 and the lower surface of the bus bar 6 (step S15). In step S15, the insulating tape 3 is bonded so as to come into contact with only the notched portion 17 in the distal end portion of the inner lead 2 and the cut lower surface of the bus bar 6 formed in step S13. Finally, the insulating tape 3 is formed into a predetermined shape (step S16).

Subsequently, the inner leads 2 are set at predetermined positions on the upper surface of the protective film 8 formed on each cut semiconductor chip 4 with the insulating tape 3 interposed therebetween, and the inner leads 2 are bonded to the semiconductor chip 4 by pressure (step S17). By heating in this state, the inner leads 2 are more strongly bonded and fixed to the semiconductor chip 4 (step S18). The heating in step S18 can be omitted in some instances. Thereafter, the bonding pad 1 in each opening 9 formed in the protective film 8 is connected to the corresponding inner lead 2 or the bus bar 6 by the bonding wire 5 (step S19), the semiconductor chip 4 is entirely encapsulated with the encapsulating resin 7 by transfer molding (step S20). Finally, the tiebars 13 and the base portion 14 in the lead frame 10 are cut and the leads are formed into a desired shape (step S21), thereby completing the package.

As described above, in the first embodiment, the lower surface of the distal end portion of the inner lead 2 is notched into a rectangular shape in advance to form the notched portion 17, and the lower surface of the bus bar 6 is also cut to have the same thickness as the notched portion 17 in the distal end portion of the inner lead 2. In this state, one surface of the insulating tape 3 is bonded to the lower surface of the notched portion 17 and the cut lower surface of the bus bar 6, and the other surface of the insulating tape 3 is bonded to the upper surface of the protective film 8 formed on the semiconductor chip 4. That is, the height from the upper surface of the protective film 8 to the upper surface of the inner lead 2 is reduced by the thickness of pieces cut from the distal end portion of the inner lead 2 and the bus bar 6 to form the notched portion 17 and the cut bus bar 6. Consequently, the thickness of the package can be reduced.

Additionally, since only predetermined portions of the inner lead 2 and the bus bar 6 are thinned, the thickness of the outer lead 12 can be kept the same as in conventional devices. Consequently, it is possible to prevent the frame from being bent or broken when the outer leads 12 are formed into a desired shape or the package is incorporated into an electronic apparatus.

Therefore, according to the first embodiment, in a semiconductor device having an LOC structure, a reliable TSOP having a thin package can be realized without reducing the thickness of a frame, a semiconductor chip, an encapsulating resin, or an insulating tape or lowering the loop of a bonding wire.

Second Embodiment

Figure 4A:
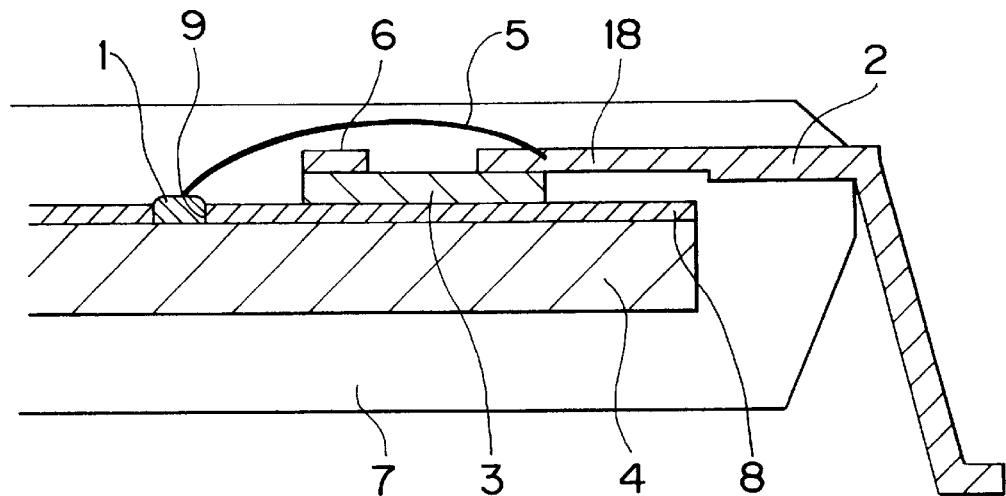
FIG. 4A is a schematic sectional view showing the semiconductor device of the second embodiment after resin encapsulation taken along the line A–A' in FIG. 1A.
Figure 4B:
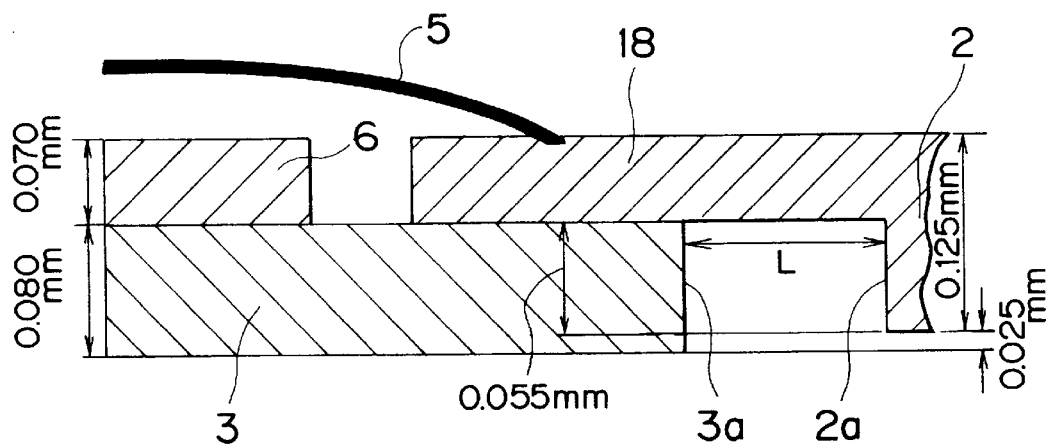
FIG. 4B is an enlarged schematic sectional view showing an insulating tape and its neighborhood in FIG. 4A of the semiconductor device of the second embodiment.

The second embodiment will be described below. The schematic arrangement of a semiconductor device according to the second embodiment is almost the same as in the first embodiment except for the positional relationship between a notched portion of an inner lead 2 and an insulating tape 3. FIG. 1A is a plan view schematically showing the semiconductor device according to the second embodiment of the present invention before resin encapsulation. FIG. 4A is a sectional view showing the semiconductor device after resin encapsulation taken along the line A–A' in FIG. 1A. FIG. 4B is an enlarged sectional view showing an insulating tape and its neighborhood in FIG. 4A.

The same reference numerals as in the semiconductor device of the first embodiment denote the same members in the second embodiment. In the semiconductor device of the second embodiment, the surface structure of a semiconductor chip 4 and the arrangement in a lead frame 10 are the same as in the first embodiment, so a detailed description thereof will be omitted. A portion where the inner lead 2 is bonded to the semiconductor chip 4, which is different from that in the first embodiment, will be described below with reference to the accompanying drawings.

In the semiconductor device of the second embodiment, as shown in FIG. 4A, the lower surface of the lead frame 10 is located on the upper surface of the semiconductor chip 4, on which a protective film 8 is formed, so that bonding pads 1 appear between opposing bus bars 6. The distal end portions of the inner leads 2 and the lower surfaces of the bus bars 6 are bonded and fixed to the upper surface of the protective film 8 with the insulating tape 3 having a thickness of about 0.08 mm interposed therebetween.

As shown in FIG. 4B, the lower surfaces of the distal end portion of the inner lead 2 and the bus bar 6 are notched into a rectangular shape or cut, and each inner lead 2 has a notched portion 18 in its distal end portion. That is, the notched portion 18 and the cut bus bar 6 are made thinner than the other portion of the inner lead 2. This embodiment is different from the first embodiment in that the insulating tape 3 is bonded to a part of the notched portion 18 formed in the inner lead 2 and consequently an end face 2a of the notched portion 18 is positioned apart from an end face 3a of the insulating tape 3 by a predetermined distance L. Since a clearance of the distance L is formed between the end face 2a of the notched portion 18 and the end face 3a of the insulating tape 3, it is possible to prevent the insulating tape 3 from bonding to a portion other than the notched portion 18 of the inner lead 2 even if the inner lead 2 is set on the insulating tape 3 with some position shift when they are bonded.

The thickness of the notched portion 18 and the cut bus bar 6 can be reduced to the processing limit. In this embodiment, the thickness of the notched portion 18 is 0.07 mm to prevent the lead frame 10 from being bent or broken when the lead frame 10 is bonded to the semiconductor chip 4. Also, the thickness of the cut bus bar 6 is equal or nearly equal to that of the notched portion 18 of the inner lead 2. Accordingly, although the height from the upper surface of the protective film 8 to the upper surface of the inner lead 2 is about 0.205 mm in conventional semiconductor devices, this height is about 0.150 mm in the semiconductor device of this embodiment. That is, the height is reduced by 0.055 mm correspondingly to the thickness of a piece cut from the distal end portion of the inner lead 2 to form the notched portion 18. Consequently, the thickness of a package can be reduced.

A method of manufacturing the semiconductor device of the second embodiment is the same as that of the first embodiment shown in FIG. 3, so a detailed description thereof will be omitted.

As described above, in the second embodiment, the lower surface of the distal end portion of the inner lead 2 is notched into a rectangular shape in advance to form the notched portion 18, and the lower surface of the bus bar 6 is also cut to have the same thickness as the notched portion 18 in the distal end portion of the inner lead 2. In this state, one surface of the insulating tape 3 is bonded to the lower surface of the notched portion 18 and the cut lower surface of the bus bar 6, and the other surface of the insulating tape 3 is bonded to the upper surface of the protective film 8 formed on the semiconductor chip 4. That is, the height from the upper surface of the protective film 8 to the upper surface of the inner lead 2 is reduced by the thickness of pieces cut from the distal end portion of the inner lead 2 and the bus bar 6 to form the notched portion 18 and the cut bus bar 6. Consequently, the thickness of the package can be reduced.

Additionally, one surface of the insulating tape 3 is bonded to only part of the notched portion 18 formed in the inner lead 2, and a space is formed under the rest of the notched portion 18. Consequently, it is possible to prevent the insulating tape 3 from bonding to a portion other than the notched portion 18 of the inner lead 2 even if the inner lead 2 is set on the insulating tape 3 with some position shift when they are bonded. Furthermore, since only predetermined portions of the inner lead 2 and the bus bar 6 are thinned, the thickness of the outer lead 12 can be kept the same as in conventional devices. Consequently, it is possible to prevent the frame from being bent or broken when the outer leads 12 are formed into a desired shape or the package is incorporated into an electronic apparatus.

Therefore, according to the second embodiment, in a semiconductor device having an LOC structure, a reliable TSOP having a thin package can be realized without reducing the thickness of a frame, a semiconductor chip, an encapsulating resin, or an insulating tape or lowering the loop of a bonding wire.

Third Embodiment

Figure 5:
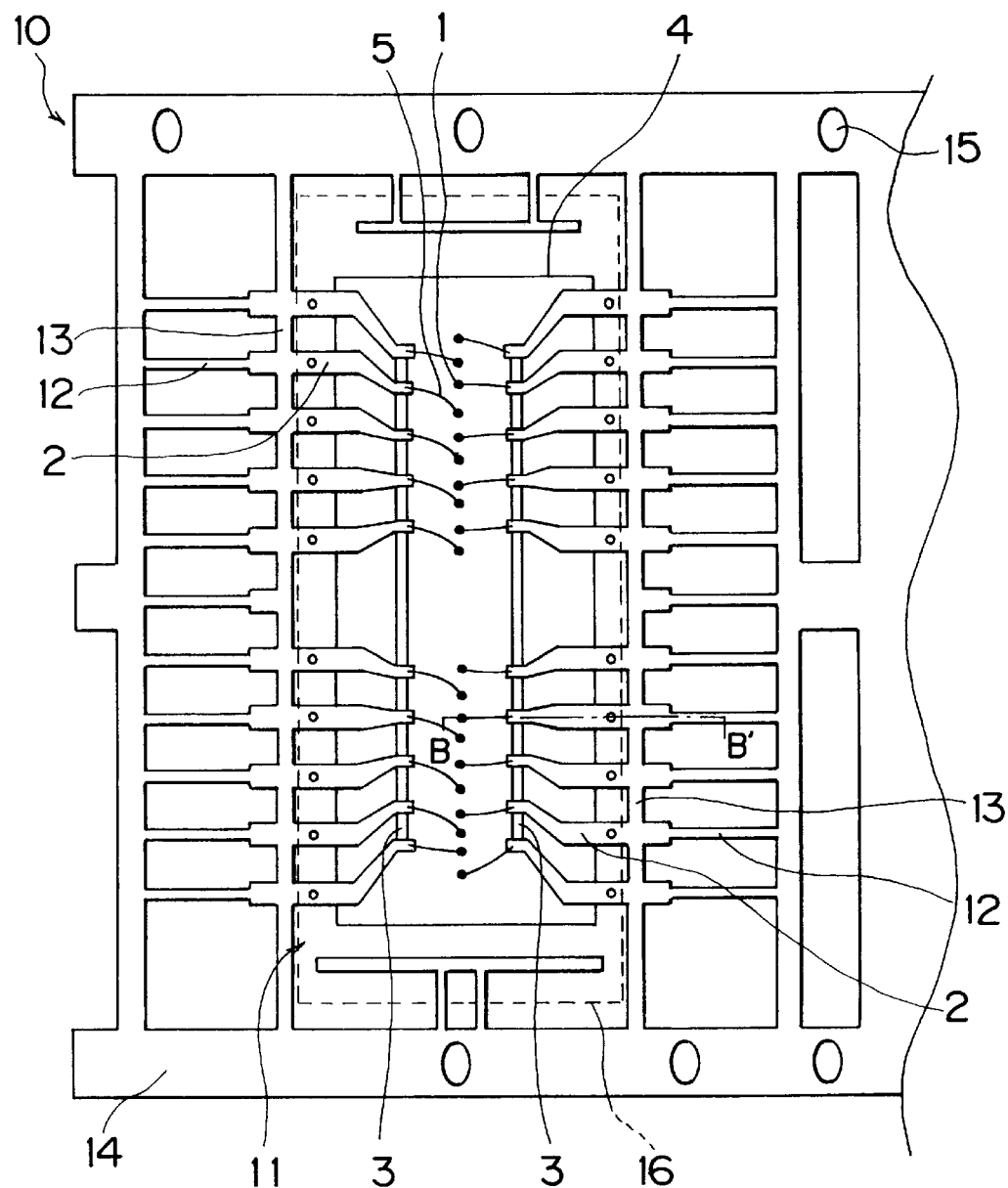
FIG. 5 is a schematic plan view showing a resin-encapsulated semiconductor device according to the third and sixth embodiment of the present invention before resin encapsulation.
Figure 6A:
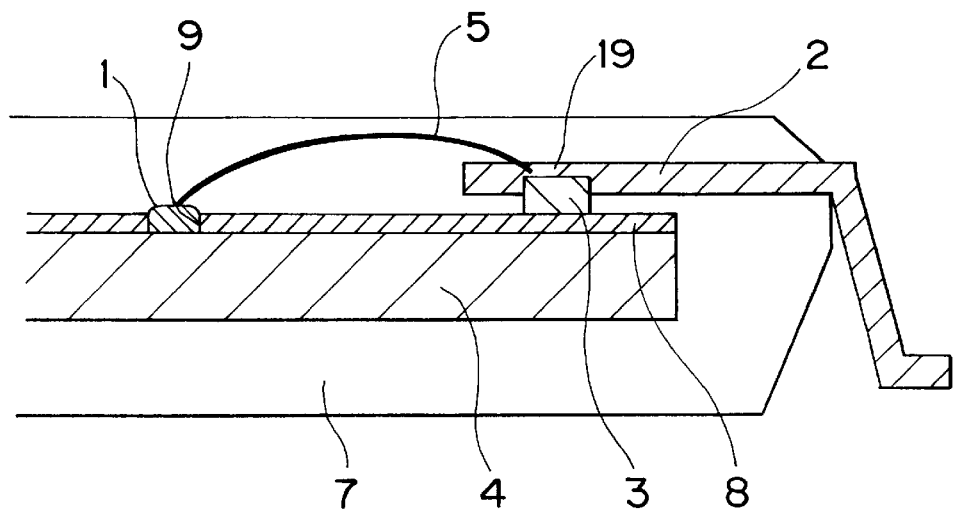
FIG. 6A is a schematic sectional view showing the semiconductor device of the third embodiment after resin encapsulation taken along a line B–B' in FIG. 5.
Figure 6B:
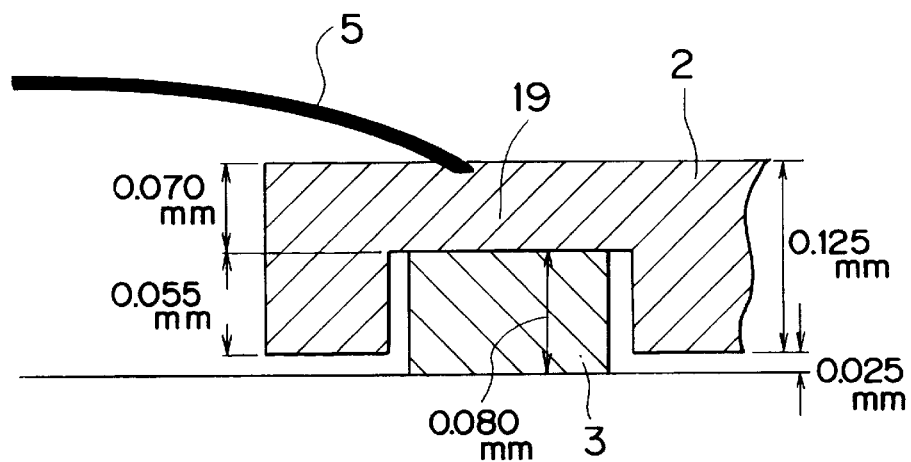
FIG. 6B is an enlarged schematic sectional view showing an insulating tape and its neighborhood in FIG. 6A of the semiconductor device of the third embodiment.

The third embodiment will be described below. The schematic arrangement of a semiconductor device according to the third embodiment is almost the same as in the first embodiment except for the processed shapes of an inner lead 2 and an insulating tape 3. FIG. 5 is a plan view schematically showing the semiconductor device according to the third embodiment of the present invention before resin encapsulation. FIG. 6A is a sectional view showing the semiconductor device after resin encapsulation taken along a line B–B' in FIG. 5. FIG. 6B is an enlarged sectional view showing an insulating tape and its neighborhood in FIG. 6A.

The same reference numerals as in the semiconductor device of the first embodiment denote the same members in the third embodiment. In the semiconductor device of the third embodiment, the surface structure of a semiconductor chip 4 is the same as in the first embodiment, so a detailed description thereof will be omitted. The arrangement in a lead frame 10 is also the same as in the first embodiment except that the bus bars 6 are omitted from the lead frame 10 in the first embodiment. A portion where the inner lead 2 is bonded to the semiconductor chip 4 will be described below with reference to the accompanying drawings.

In the semiconductor device of the third embodiment, as shown in FIG. 6A, the lower surface of the lead frame 10 is located on the upper surface of the semiconductor chip 4, on which a protective film 8 is formed, so that bonding pads 1 appear between the distal end portions of the opposing inner leads 2. The distal end portions of the inner leads 2 are bonded and fixed to the upper surface of the protective film 8 with the insulating tape 3 having a thickness of about 0.08 mm interposed therebetween.

As shown in FIG. 6B, the lower surface of the distal end portion of the inner lead 2 is notched to form a recessed portion 19. It is only necessary that the whole or part of the recessed portion 19 formed in the inner lead 2 is positioned above the semiconductor chip 4. Accordingly, the position of the recessed portion 19 is freely set in accordance with the design of a package or the circuit design of the semiconductor chip 4.

The recessed portion 19 preferably has a length of about 0.3 to 0.4 mm, since the upper surface of the recessed portion 19 is used as a pressure bonding region for a bonding wire 5. The thickness of the recessed portion 19 can be reduced to the processing limit. In this embodiment, the thickness of the recessed portion 19 is 0.07 mm to prevent the lead frame 10 from being bent or broken when the lead frame 10 is bonded to the semiconductor chip 4. Accordingly, although the height from the upper surface of the protective film 8 to the upper surface of the inner lead 2 is about 0.205 mm in conventional semiconductor devices, this height is about 0.150 mm in the semiconductor device of this embodiment. That is, the height is reduced by 0.055 mm corresponding to the thickness of a piece cut from the distal end portion of the inner lead 2 to form the recessed portion 19. Consequently, the thickness of the package can be reduced.

A method of manufacturing the semiconductor device of the third embodiment is the same as that of the first embodiment shown in FIG. 3, so a detailed description thereof will be omitted.

As described above, in the third embodiment, the lower surface of the distal end portion of the inner lead 2 is notched in advance to form the recessed portion 19. In this state, one surface of the insulating tape 3 is bonded to the lower surface of the recessed portion 19 in the distal end portion of the inner lead 2, and the other surface of the insulating tape 3 is bonded to the upper surface of the protective film 8 formed on the semiconductor chip 4. That is, the height from the upper surface of the protective film 8 to the upper surface of the inner lead 2 is reduced by the thickness of a piece cut from the distal end portion of the inner lead 2 to form the recessed portion 19. Consequently, the thickness of the package can be reduced.

Additionally, it is only necessary that the whole or part of the recessed portion 19 formed in the inner lead 2 is positioned above the semiconductor chip 4. Consequently, the position where the inner lead 2 is bonded to the semiconductor chip 4 can be freely set in accordance with the design of a package or the circuit design of the semiconductor chip 4. Furthermore, since only a predetermined portion of the inner lead 2 is thinned, it is possible to prevent the frame from being bent or broken when outer leads 12 are formed into a desired shape or the package is incorporated into an electronic apparatus.

Therefore, according to the third embodiment, in a semiconductor device having an LOC structure, a reliable TSOP having a thin package can be realized without reducing the thickness of a frame, a semiconductor chip, an encapsulating resin, or an insulating tape or lowering the loop of a bonding wire.

Fourth Embodiment

Figure 7:
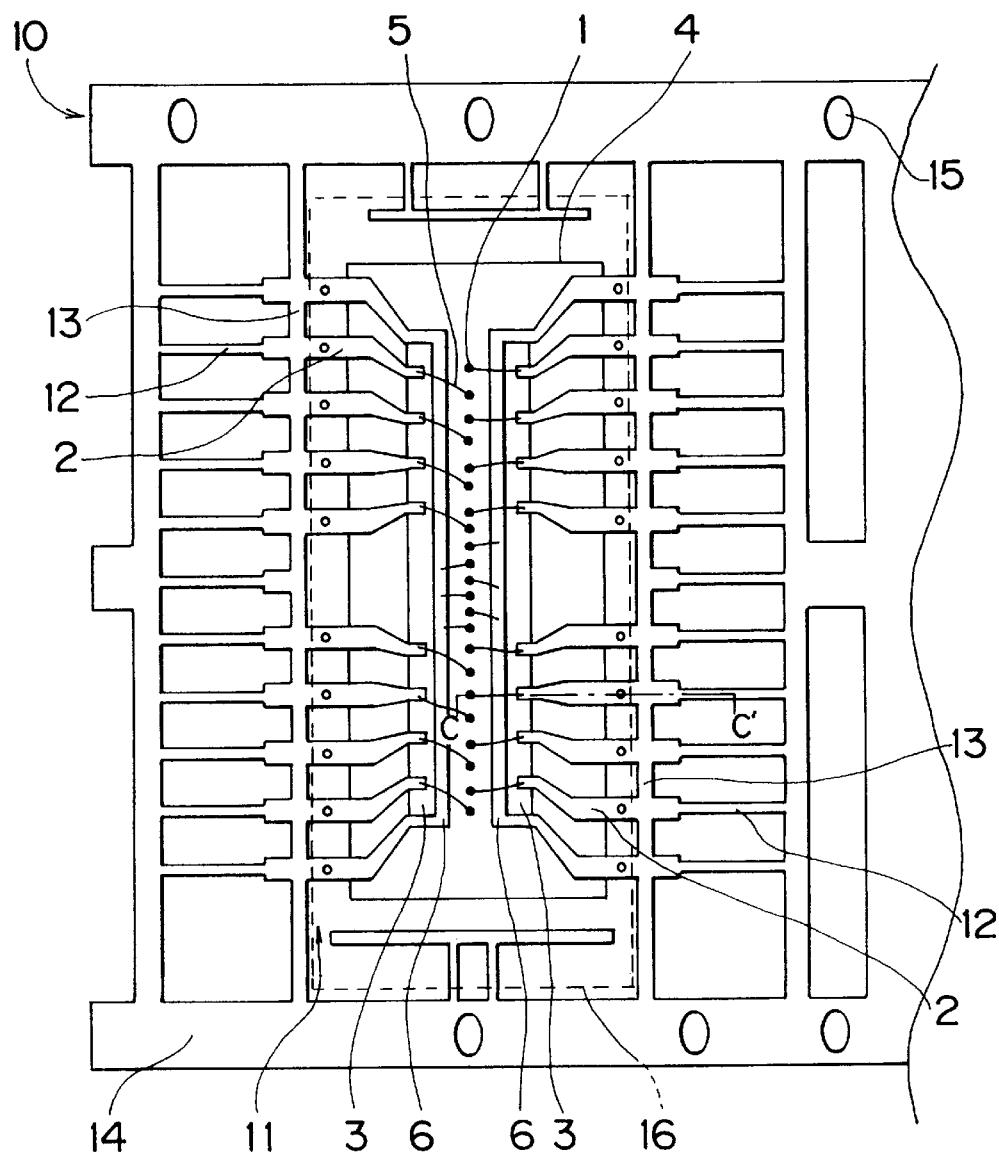
FIG. 7 is a schematic plan view showing a resin-encapsulated semiconductor device according to the fourth and fifth embodiment of the present invention before resin encapsulation.
Figure 8A:
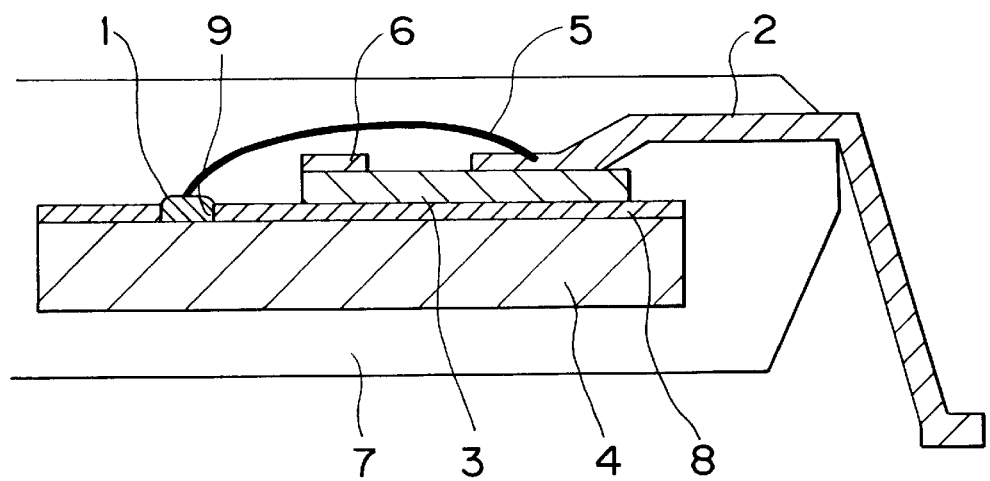
FIG. 8A is a schematic sectional view showing the semiconductor device of the fourth embodiment after resin encapsulation taken along a line C–C' in FIG. 7.
Figure 8B:
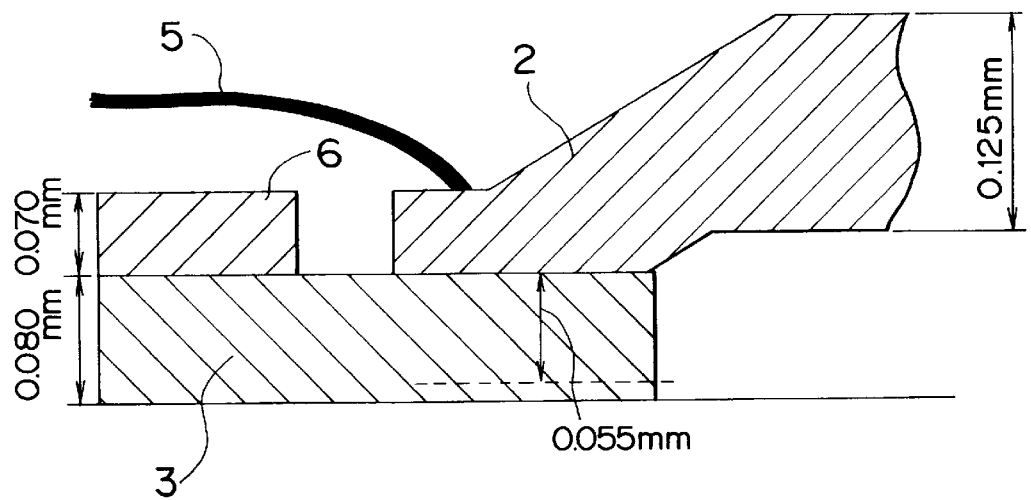
FIG. 8B is an enlarged schematic sectional view showing an insulating tape and its neighborhood in FIG. 8A of the semiconductor device of the fourth embodiment.

The fourth embodiment will be described below. The schematic arrangement of a semiconductor device according to the fourth embodiment is almost the same as in the first embodiment except for the processed shape of an inner lead 2. FIG. 7 is a plan view schematically showing the semiconductor device according to the fourth embodiment of the present invention before resin encapsulation. FIG. 8A is a sectional view showing the semiconductor device after resin encapsulation taken along a line C–C' in FIG. 7. FIG. 8B is an enlarged sectional view showing an insulating tape and its neighborhood in FIG. 8A.

The same reference numerals as in the semiconductor device of the first embodiment denote the same members in the fourth embodiment. In the semiconductor device of the fourth embodiment, the surface structure of a semiconductor chip 4 and the arrangement in a lead frame 10 are the same as in the first embodiment, so a detailed description thereof will be omitted. A portion where the inner lead 2 is bonded to the semiconductor chip 4, which is different from that in the first embodiment, will be described below with reference to the accompanying drawings.

In the semiconductor device of the fourth embodiment, as shown in FIG. 8A, the lower surface of the lead frame 10 is located on the upper surface of the semiconductor chip 4, on which a protective film 8 is formed, so that bonding pads 1 appear between opposing bus bars 6. The distal end portions of the inner leads 2 and the lower surfaces of the bus bars 6 are bonded and fixed to the upper surface of the protective film 8 with an insulating tape 3 having a thickness of about 0.08 mm interposed therebetween.

As shown in FIG. 8B, the distal end portion of the inner lead 2 and the bus bar 6 are offset downwardly from the level of the lead frame 10. Additionally, the lower surfaces of the offset distal end portion of the inner lead 2 and the offset bus bar 6, which come into contact with the insulating tape 3, are cut. That is, the distal end portion of the inner lead 2 and the bus bar 6 are made thinner than an outer lead 12 and the other portion of the inner lead 2.

The thickness of the cut distal end portion of the inner lead 2 and the cut bus bar 6 can be reduced to the processing limit. In this embodiment, the thickness of the cut distal end portion of the inner lead 2 is 0.07 mm to prevent the lead frame 10 from being bent or broken when the lead frame 10 is bonded to the semiconductor chip 4. Also, the thickness of the cut bus bar 6 is equal or nearly equal to that of the cut distal end portion of the inner lead 2. Accordingly, when the thickness of the lead is about 0.125 mm as in a normal case, although the height from the upper surface of the protective film 8 to the upper surface of the offset inner lead 2 is about 0.205 mm in conventional semiconductor devices, this height is about 0.150 mm in the semiconductor device of this embodiment. That is, the height is reduced by 0.055 mm corresponding to the thickness of a piece cut from the lower surface of the distal end portion of the inner lead 2. Consequently, the thickness of a package can be reduced.

The upper surface of the offset distal end portion of each inner lead 2 is connected to the bonding pad 1 corresponding to each inner lead 2 by a bonding wire 5 consisting of gold (Au) by what is called wire bonding. The bonding wire 5 may be a copper (Cu) wire, a coated wire formed by coating the surface of a metal wire with an insulating resin, or the like.

Note that, in FIGS. 8A and 8B, the insulating tape 3 is bonded to the entire lower surface of the offset thinned portion of the inner lead 2. When the bonded portion of the inner lead 2 has a length of at least about 0.3 to 0.4 mm, the upper surface of the bonded portion of the inner lead 2 can serve as a pressure bonding region for a bonding wire 5.

Figure 9A:
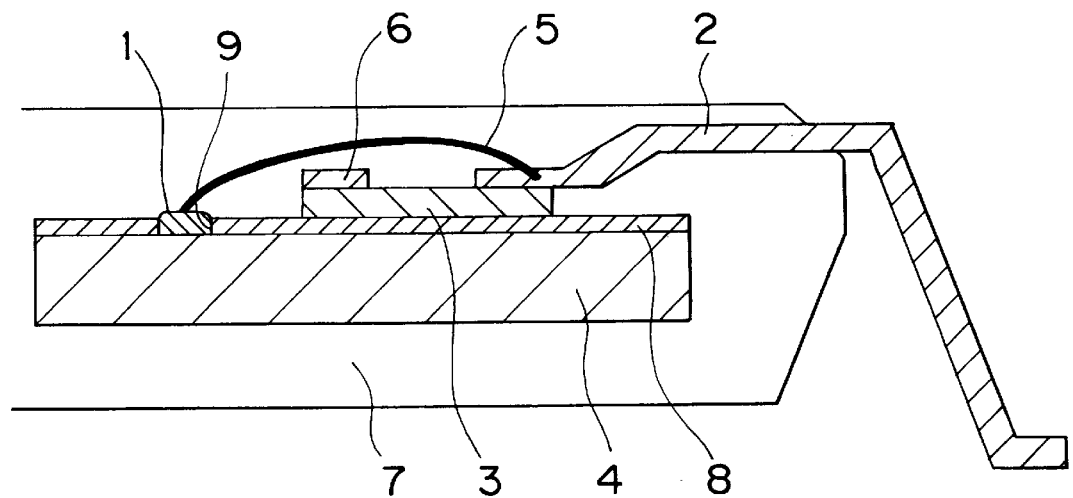
FIG. 9A is a schematic sectional view showing another semiconductor device of the fourth embodiment after resin encapsulation taken along the line C–C' in FIG. 7.
Figure 9B:
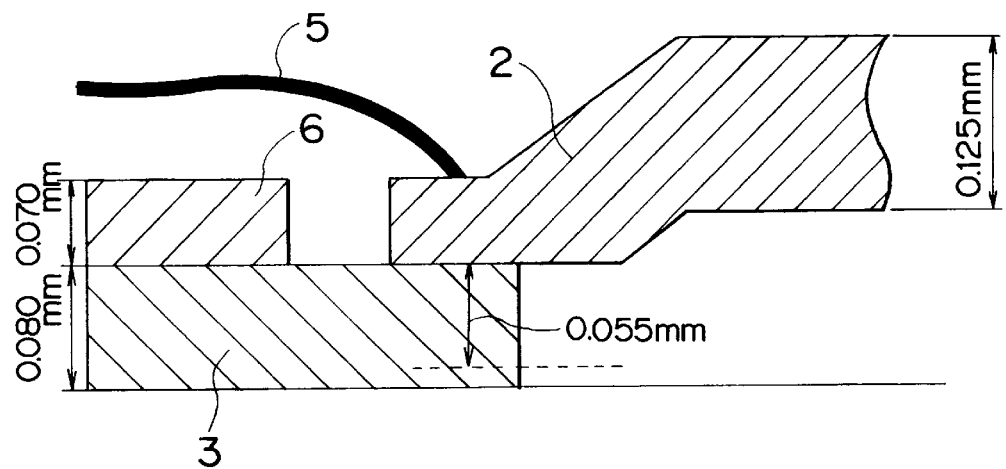
FIG. 9B is an enlarged schematic sectional view showing an insulating tape and its neighborhood in FIG. 9A of another semiconductor device of the fourth embodiment.

As shown in FIGS. 9A and 9B, therefore, the insulating tape 3 can also be bonded to only part of the offset thinned portion of the inner lead 2.

Figure 10:
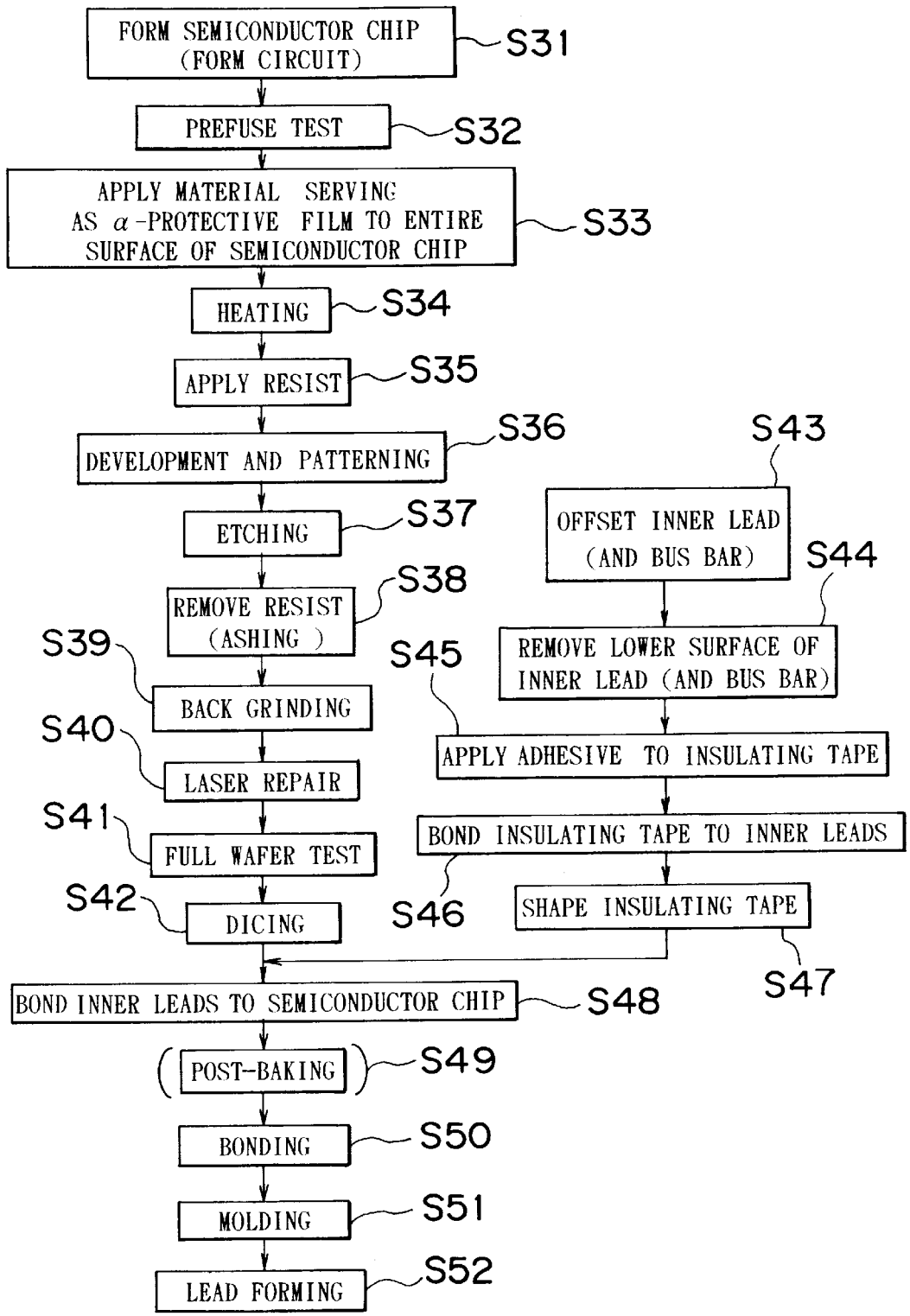
FIG. 10 is a schematic flow chart showing steps of manufacturing the resin-encapsulated semiconductor devices according to the fourth, fifth, and sixth embodiment of the present invention in order of manufacturing steps.

A method of manufacturing the semiconductor device of the fourth embodiment will be described below. FIG. 10 is a schematic flow chart showing the steps in manufacturing the semiconductor device of this embodiment in order of steps.

First, memory cells and their peripheral circuits are formed on a semiconductor wafer to form a plurality of semiconductor chips 4 on the semiconductor wafer (step S31).

Subsequently, a pre-fuse test is performed for the semiconductor chips 4 (step S32), and the α-ray protective film 8 is formed on the entire surface of each semiconductor chip 4 (step S33). After the semiconductor wafer is heated to more strongly bond the protective film 8 to the semiconductor wafer (step S34), a resist is applied to the entire surface of the semiconductor wafer (step S35) and normal photolithography is performed (step S36). A plurality of openings 9 are formed in the protective film 8 to expose the bonding pads 1 formed on the semiconductor chip 4 by normal anisotropic etching (step s37). After the resist is removed by ashing (step S38), the thickness of the semiconductor chip 4 is adjusted by back grinding (step S39). Thereafter, laser repair is performed (step S40), and a full wafer test is performed (step S41).

Subsequently, dicing is performed to cut the semiconductor wafer into the semiconductor chips 4 (step S42). in parallel with the processing in step S42, the following five steps are performed. First, the distal end portion of the inner lead 2 and the bus bar 6 in the lead frame 10 are offset downwardly by, e.g., pressing (step S43). The offset amount is preferably equivalent to the loop height of the bonding wire 5. The offset distal end portion of the inner lead 2 and the offset bus bar 6 are thinned by cutting their lower surfaces (step S44). This processing may be performed not only by cutting but also by other techniques for removal and is preferably performed by, e.g., etching, polishing, pressing, or rolling. After an adhesive is applied to the two surfaces of the insulating tape 3 (step S45), one surface of the insulating tape 3 is bonded to the inner leads 2 and the lower surface of the bus bar 6 (step S46). In step S46, the insulating tape 3 is bonded so as to come into contact with only the cut lower surfaces of the offset distal end portion of the inner lead 2 and the offset bus bar 6. Finally, the insulating tape 3 is formed into a predetermined shape (step S47).

Subsequently, the inner leads 2 are set at predetermined positions on the upper surface of the protective film 8 formed on each cut semiconductor chip 4 with the insulating tape 3 interposed therebetween, and the inner leads 2 are bonded to the semiconductor chip 4 by pressure (step S48). By heating in this state, the inner leads 2 are more strongly bonded and fixed to the semiconductor chip 4 (step S49). The heating in step S49 can be omitted in some instances. Thereafter, the bonding pad 1 in each opening 9 formed in the protective film 8 is connected to the corresponding inner leads 2 or the bus bar 6 by the bonding wire 5 (step S50), the semiconductor chip 4 is entirely encapsulated with the encapsulating resin 7 by transfer molding (step S51). Finally, tiebars 13 and a base portion 14 in the lead frame 10 are cut and the leads are formed into a desired shape (step S52), thereby completing the package.

As described above, in the fourth embodiment, the distal end portion of the inner lead 2 and the bus bar 6 are offset in advance, and the offset distal end portion of the inner lead 2 and the offset bus bar 6 are thinned by cutting their lower surfaces. In this state, one surface of the insulating tape 3 is bonded only to the cut lower surfaces of the offset distal end portion of the inner lead 2 and the offset bus bar 6, and the other surface of the insulating tape 3 is bonded to the upper surface of the protective film 8 formed on the semiconductor chip 4, thereby bonding the inner lead 2 to the semiconductor chip 4 with the insulating tape 3 interposed therebetween. That is, the height from the upper surface of the protective film 8 to the upper surface of the inner lead 2 is reduced by the thickness of pieces cut from the lower surfaces of the distal end portion of the inner lead 2 and the bus bar 6. Consequently, the thickness of the package can be reduced.

Additionally, since only predetermined portions of the inner lead 2 and the bus bar 6 are thinned, the thickness of the outer lead 12 can be kept the same as in conventional devices. Consequently, it is possible to prevent the frame from being bent or broken when the outer leads 12 are formed into a desired shape or the package is incorporated into an electronic apparatus.

Therefore, according to the fourth embodiment, in a semiconductor device having an LOC structure, a reliable TSOP having a thin package can be realized without reducing the thickness of a frame, a semiconductor chip, an encapsulating resin, or an insulating tape or lowering the loop of a bonding wire.

Fifth Embodiment

The fifth embodiment will be described below. The schematic arrangement of a semiconductor device according to the fifth embodiment is almost the same as in the fourth embodiment except for the positional relationship between a thinned portion of an inner lead 2 and an insulating tape 3.

Figure 11A:
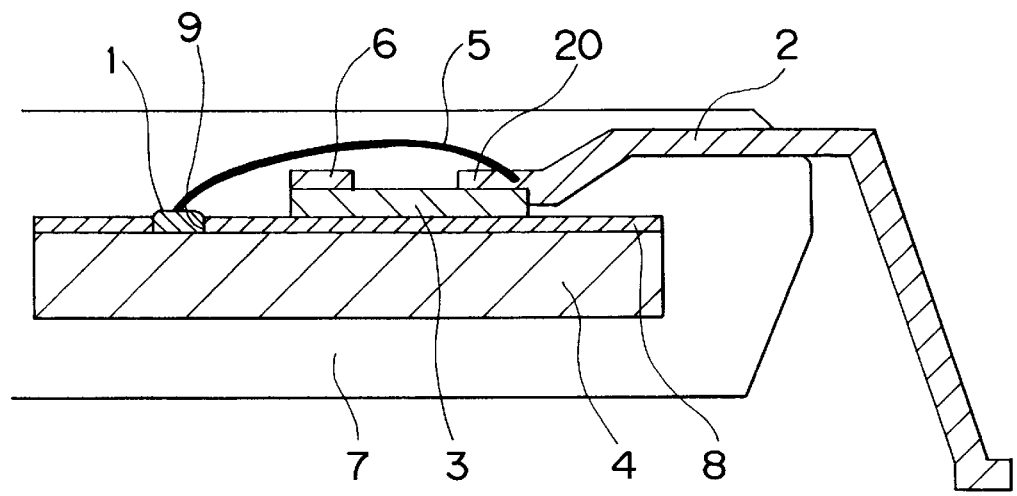
FIG. 11A is a schematic sectional view showing the semiconductor device of the fifth embodiment after resin encapsulation taken along the line C–C' in FIG. 7.
Figure 11B:
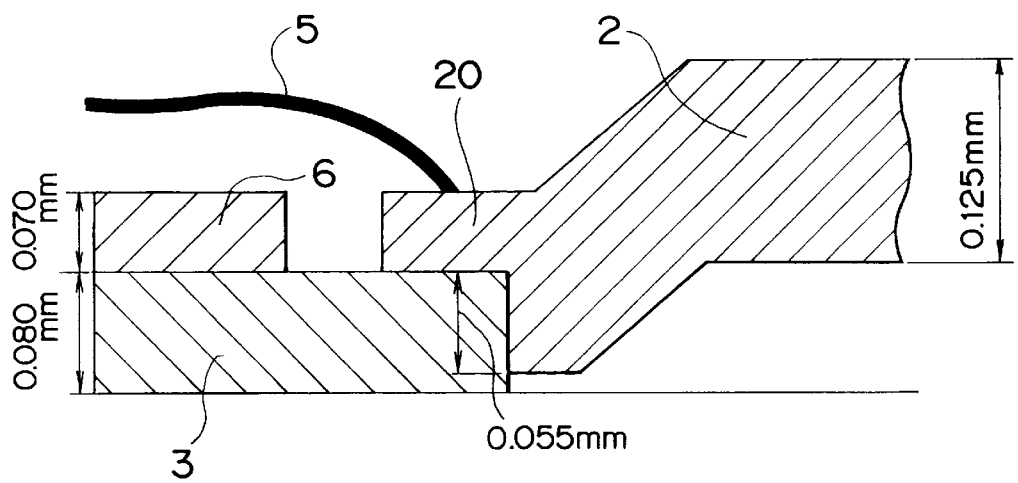
FIG. 11B is an enlarged schematic sectional view showing an insulating tape and its neighborhood in FIG. 11A of the semiconductor device of the fifth embodiment.

A plan view of the semiconductor device according to the fifth embodiment of the present invention before resin encapsulation is exactly the same as FIG. 7, so this plan view will be omitted. FIG. 11A is a sectional view showing the semiconductor device after resin encapsulation taken along the line C–C' in FIG. 7. FIG. 11B is an enlarged sectional view showing an insulating tape and its neighborhood in FIG. 11A.

The same reference numerals as in the semiconductor device of the fourth embodiment denote the same members in the fifth embodiment. In the semiconductor device of the fifth embodiment, the surface structure of a semiconductor chip 4 and the arrangement in a lead frame 10 are the same as in the fourth embodiment, so a detailed description thereof will be omitted. A portion where the inner lead 2 is bonded to the semiconductor chip 4, which is different from that in the fourth embodiment, will be described below with reference to the accompanying drawings.

In the semiconductor device of the fifth embodiment, as shown in FIG. 11A, the lower surface of the lead frame 10 is located on the upper surface of the semiconductor chip 4, on which a protective film 8 is formed, so that bonding pads 1 appear between opposing bus bars 6. The distal end portions of the inner leads 2 and the lower surfaces of the bus bars 6 are bonded and fixed to the upper surface of the protective film 8 with the insulating tape 3 having a thickness of about 0.08 mm interposed therebetween.

As shown in FIG. 11B, the distal end portion of the inner lead 2 and the bus bar 6 are offset downwardly from the level of the lead frame 10. Additionally, the lower surfaces of the offset distal end portion of the inner lead 2 and the offset bus bar 6, which come into contact with the insulating tape 3, are notched into a rectangular shape or cut, and each inner lead 2 has a notched portion 20 in its distal end portion.

The thickness of the notched portion 20 and the cut bus bar 6 can be reduced to the processing limit. In this embodiment, the thickness of the notched portion 20 is 0.07 mm to prevent the lead frame 10 from being bent or broken when the lead frame 10 is bonded to the semiconductor chip 4. Also, the thickness of the cut bus bar 6 is equal or nearly equal to that of the notched portion 20 of the inner lead 2. Accordingly, when the thickness of the lead is about 0.125 mm as in a normal case, although the height from the upper surface of the protective film 8 to the upper surface of the offset inner lead 2 is about 0.205 mm in conventional semiconductor devices, this height is about 0.150 mm in the semiconductor device of this embodiment. That is, the height is reduced by 0.055 mm corresponding to the thickness of a piece cut from the distal end portion of the inner lead 2 to form the notched portion 20. Consequently, the thickness of a package can be reduced.

A method of manufacturing the semiconductor device of the fifth embodiment is the same as that of the fourth embodiment shown in FIG. 10, so a detailed description thereof will be omitted.

As described above, in the fifth embodiment, the distal end portion of the inner lead 2 and the bus bar 6 are offset in advance. Thereafter, the lower surface of the offset distal end portion of the inner lead 2 is notched into a rectangular shape to form the notched portion 20, and the lower surface of the offset bus bar 6 is also cut. In this state, one surface of the insulating tape 3 is bonded only to the lower surface of the notched portion 20 in the distal end portion of the inner lead 2 and the cut lower surface of the bus bar 6, and the other surface of the insulating tape 3 is bonded to the upper surface of the protective film 8 formed on the semiconductor chip 4. That is, the height from the upper surface of the protective film 8 to the upper surface of the inner lead 2 is reduced by the thickness of pieces cut from the distal end portion of the inner lead 2 and the bus bar 6 to form the notched portion 20 and the cut bus bar 6. Consequently, the thickness of the package can be reduced.

Additionally, since only predetermined portions of the inner lead 2 and the bus bar 6 are thinned, the thickness of an outer lead 12 can be kept the same as in conventional devices. Consequently, it is possible to prevent the frame from being bent or broken when the outer leads 12 are formed into a desired shape or the package is incorporated into an electronic apparatus.

Therefore, according to the fifth embodiment, in a semiconductor device having an LOC structure, a reliable TSOP having a thin package can be realized without reducing the thickness of a frame, a semiconductor chip, an encapsulating resin, or an insulating tape or lowering the loop of a bonding wire.

Sixth Embodiment

Figure 12A:
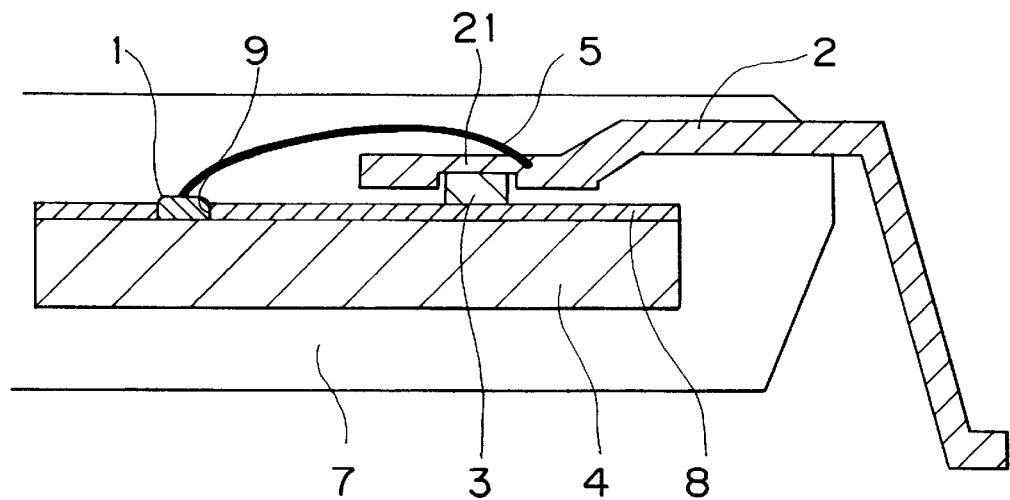
FIG. 12A is a schematic sectional view showing the semiconductor device of the sixth embodiment after resin encapsulation taken along the line B–B' in FIG. 5.
Figure 12B:
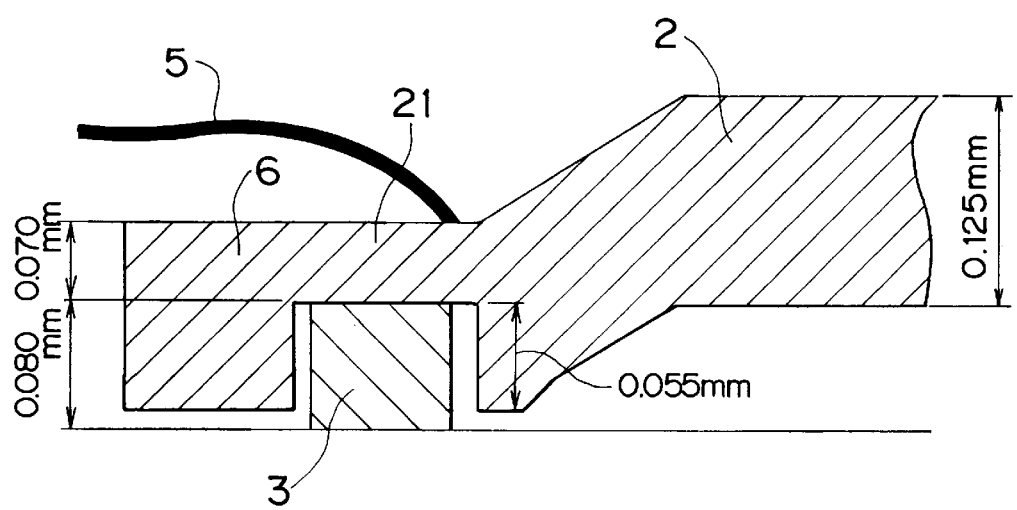
FIG. 12B is an enlarged schematic sectional view showing an insulating tape and its neighborhood in FIG. 12A of the semiconductor device of the sixth embodiment.
Figure 13A:
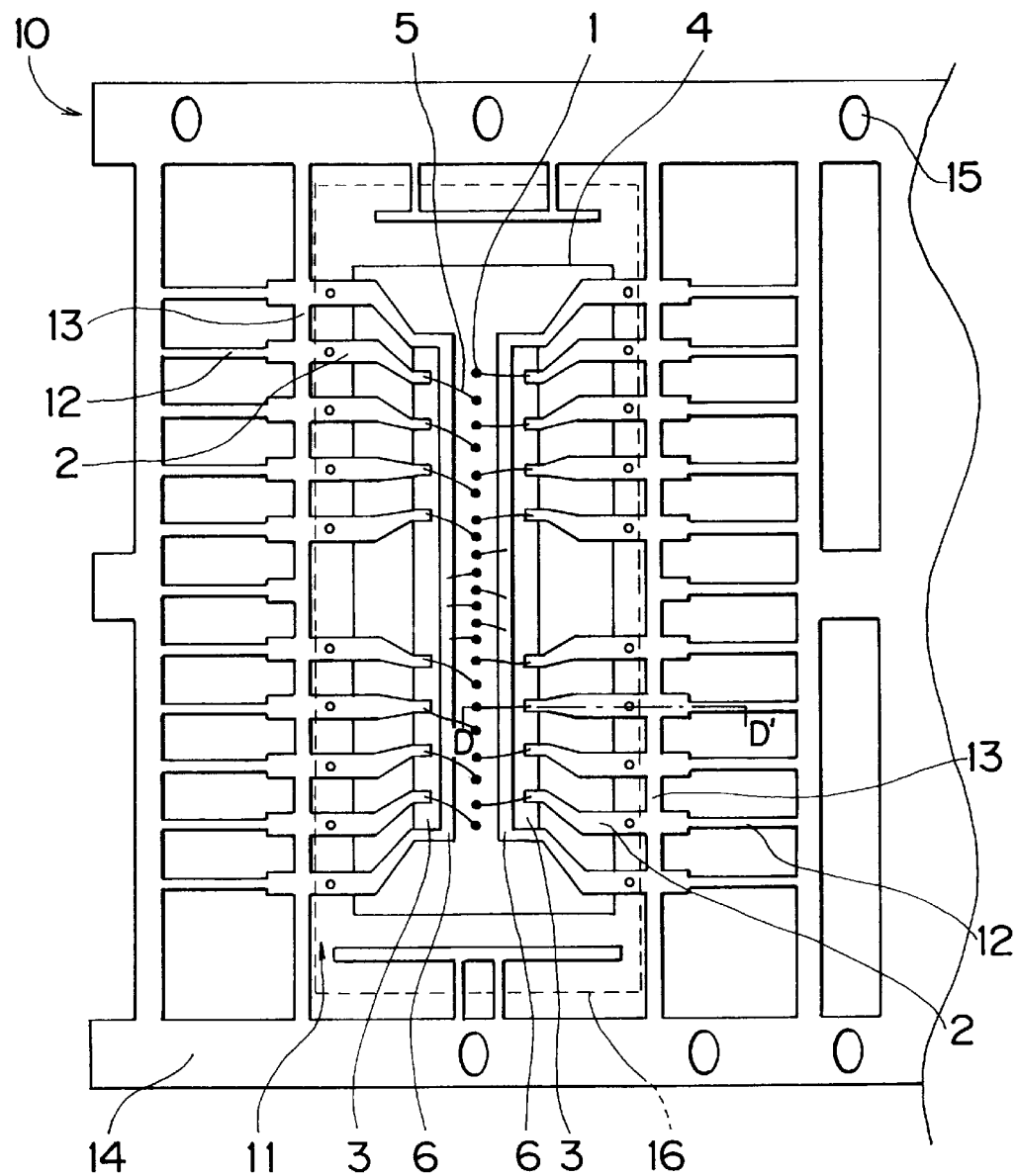
FIG. 13A is a schematic plan view showing a conventional semiconductor device before resin encapsulation.
Figure 13B:
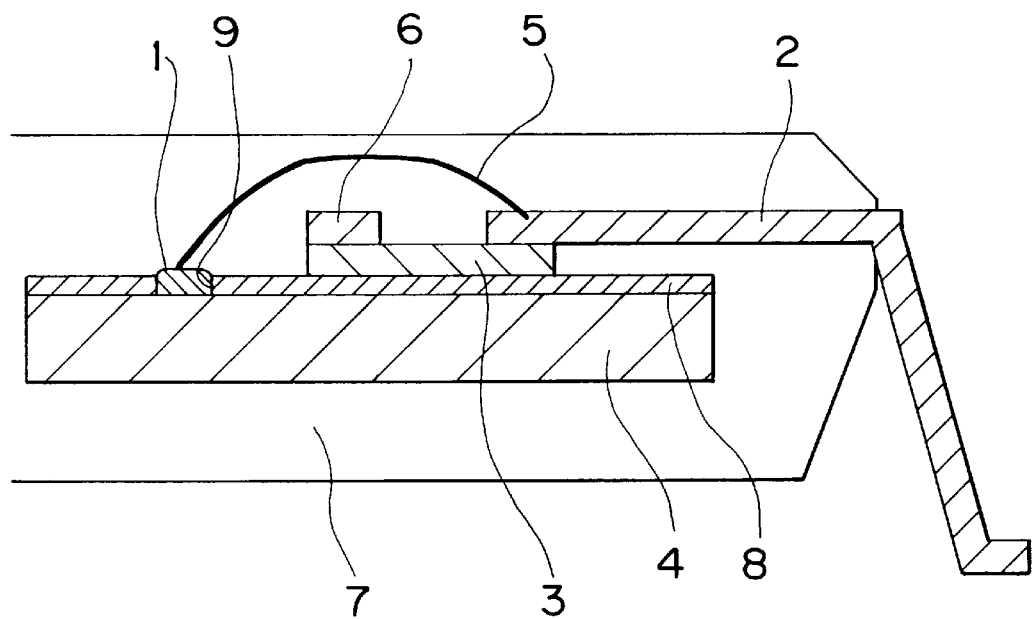
FIG. 13B is a schematic sectional view showing the conventional semiconductor device after resin encapsulation taken along a line D–D' in FIG. 13A.

The sixth embodiment will be described below. The schematic arrangement of a semiconductor device according to the sixth embodiment is almost the same as in the third embodiment except for the processed shapes of an inner lead 2. A plan view of the semiconductor device according to the sixth embodiment of the present invention before resin encapsulation is exactly the same as FIG. 5, so this plan view will be omitted. FIG. 12A is a sectional view showing the semiconductor device after resin encapsulation taken along the line B–B' in FIG. 5. FIG. 12B is an enlarged sectional view showing an insulating tape and its neighborhood in FIG. 12A.

The same reference numerals as in the semiconductor device of the third embodiment denote the same members in the sixth embodiment. In the semiconductor device of the sixth embodiment, the surface structure of a semiconductor chip 4 and the arrangement in a lead frame 10 are the same as in the third embodiment, so a detailed description thereof will be omitted. A portion where the inner lead 2 is bonded to the semiconductor chip 4 will be described below with reference to the accompanying drawings.

In the semiconductor device of the sixth embodiment, as shown in FIG. 12A, the lower surface of the lead frame 10 is located on the upper surface of the semiconductor chip 4, on which a protective film 8 is formed, so that bonding pads 1 appear between the distal end portions of the opposing inner leads 2. The distal end portions of the inner leads 2 are bonded and fixed to the upper surface of the protective film 8 with an insulating tape 3 having a thickness of about 0.08 mm interposed therebetween.

As shown in FIG. 12B, the distal end portion of the inner lead 2 is offset downwardly from the level of the lead frame 10. Additionally, the lower surface of the offset distal end portion of the inner lead 2, which comes into contact with the insulating tape 3, is notched to form a recessed portion 21. It is only necessary that the whole or part of the recessed portion 21 formed in the inner lead 2 is positioned above the semiconductor chip 4. Accordingly, the position of the recessed portion 21 is freely set in accordance with the design of a package or the circuit design of the semiconductor chip 4.

The recessed portion 21 preferably has a length of about 0.3 to 0.4 mm, since the upper surface of the recessed portion 21 is used as a pressure bonding region for a bonding wire 5. The thickness of the recessed portion 21 can be reduced to the processing limit. In this embodiment, the thickness of the recessed portion 21 is 0.07 mm to prevent the lead frame 10 from being bent or broken when the lead frame 10 is bonded to the semiconductor chip 4. Accordingly, when the thickness of the lead is about 0.125 mm as in a normal case, although the height from the upper surface of the protective film 8 to the upper surface of the offset inner lead 2 is about 0.205 mm in conventional semiconductor devices, this height is about 0.150 mm in the semiconductor device of this embodiment. That is, the height is reduced by 0.055 mm corresponding to the thickness of a piece cut from the distal end portion of the inner lead 2 to form the recessed portion 21. Consequently, the thickness of the package can be reduced.

A method of manufacturing the semiconductor device of the sixth embodiment is the same as that of the fourth embodiment shown in FIG. 10, so a detailed description thereof will be omitted.

As described above, in the sixth embodiment, the distal end portion of the inner lead 2 is offset in advance, and the lower surface of the offset distal end portion of the inner lead 2 is notched to form the recessed portion 21. In this state, one surface of the insulating tape 3 is bonded to the lower surface of the recessed portion 21 in the distal end portion of the inner lead 2, and the other surface of the insulating tape 3 is bonded to the upper surface of the protective film 8 formed on the semiconductor chip 4. That is, the height from the upper surface of the protective film 8 to the upper surface of the inner lead 2 is reduced by the thickness of a piece cut from the distal end portion of the inner lead 2 to form the recessed portion 21. Consequently, the thickness of the package can be reduced.

Additionally, it is only necessary that the whole or part of the recessed portion 21 formed in the inner lead 2 is positioned above the semiconductor chip 4. Consequently, the position where the inner lead 2 is bonded to the semiconductor chip 4 can be freely set in accordance with the design of the package or the circuit design of the semiconductor chip 4. Furthermore, since only a predetermined portion of the inner lead 2 is thinned, it is possible to prevent the frame from being bent or broken when outer leads 12 are formed into a desired shape or the package is incorporated into an electronic apparatus.

Therefore, according to the sixth embodiment, in a semiconductor device having an LOC structure, a reliable TSOP having a thin package can be realized without reducing the thickness of a frame, a semiconductor chip, an encapsulating resin, or an insulating tape or lowering the loop of a bonding wire.

What is claimed is:

1. A resin-encapsulated semiconductor device comprising:
   a semiconductor chip on which circuits are formed;
   bonding pads formed on said semiconductor chip;
   outer leads for connecting external terminals;
   inner leads connected to said outer leads;
   an insulating tape for electrically insulating said inner leads from said semiconductor chip, said inner leads bonded to a circuit formation surface of said semiconductor chip with said insulating tape interposed therebetween; and
   bonding wires electrically connecting said inner leads and bonding pads, wherein
   a thickness of at least a portion of said inner lead in contact with said insulating tape is smaller than a thickness of said outer lead
   a bus bar connecting two arbitrary ones of said inner leads and extended along end portions of the other inner leads, wherein
   a thickness of at least a portion of said bus bar in contact with said insulating tape is substantially equal to a thickness of the portion of the inner lead thinner than said outer lead.

2. The device according to claim 1, wherein a portion for pressing and bonding said bonding wire is formed on an upper surface of the portion thinner than said outer lead in said inner lead.

3. The device according to claim 1, wherein said bonding wire passes over at least the portion of said bus bar thinner than said outer lead.

4. A resin-encapsulated semiconductor device, comprising:
   a semiconductor chip on which circuits are formed;
   bonding pads formed on said semiconductor chip;
   inner leads;
   an insulating tape for electrically insulating said inner leads from said semiconductor chip, said inner leads bonded to a circuit formation surface of said semiconductor chip with said insulating tape interposed therebetween; and
   bonding wires electrically connecting said inner leads and bonding pads, wherein
   a lower surface of an end portion of said inner lead is partially removed to form a notched portion, and
   one surface of said insulating tape is bonded to at least a part of the notched portion of said inner lead and the other surface of said insulating tape is bonded to an upper surface of said semiconductor chip.

5. The device according to claim 4, wherein a portion for pressing and bonding said bonding wire is formed on an upper surface of the notched portion of said inner lead.

6. The device according to claim 4, further comprising:
   a bus bar connecting two arbitrary ones of said inner leads and extended along end portions of the other inner leads, wherein
   a thickness of at least a portion of said bus bar in contact with said insulating tape is substantially equal to a thickness of the notched portion.

7. The device according to claim 6, wherein a portion for pressing and bonding said bonding wire is formed on an upper surface of the notched portion of said inner lead.

8. The device according to claim 6, wherein said bonding wire passes over at least the portion of said bus bar having the same thickness as the notched portion of said inner lead.

9. A resin-encapsulated semiconductor device, comprising:
   a semiconductor chip on which circuits are formed;
   bonding pads formed on said semiconductor chip;
   inner leads;
   an insulating tape for electrically insulating said inner leads from said semiconductor chip, said inner leads bonded to a circuit formation surface of said semiconductor chip with said insulating tape interposed therebetween; and
   bonding wires electrically connecting said inner leads and bonding pads, wherein
   a lower surface of said inner lead is partially removed to form a recessed portion, and
   one surface of said insulating tape is bonded to at least a part of an inner surface of the recessed portion of said inner lead and the other surface of said insulating tape is bonded to an upper surface of said semiconductor chip.

10. The device according to claim 9, wherein the recessed portion is formed in at least a portion positioned above said semiconductor chip in said inner lead.

11. The device according to claim 9, wherein a portion for pressing and bonding said bonding wire is formed on an upper surface of the recessed portion of said inner lead.

12. A resin-encapsulated semiconductor device, comprising:
   a semiconductor chip on which circuits are formed;
   bonding pads formed on said semiconductor chip;
   outer leads for connecting external terminals;
   inner leads connected to said outer leads;
   an insulating tape for electrically insulating said inner leads from said semiconductor chip, said inner leads bonded to a circuit formation surface of said semiconductor chip with said insulating tape interposed therebetween; and
   bonding wires electrically connecting said inner leads and bonding pads, wherein
   an end portion of said inner lead is thinner than said outer lead and is located downwardly from a portion of said inner lead connected to said outer lead, and
   one surface of said insulating tape is bonded to at least a part of a lower surface of the end portion of said inner lead and the other surface of said insulating tape is bonded to an upper surface of said semiconductor chip.

13. The device according to claim 12, wherein a portion for pressing and bonding said bonding wire is formed on an upper surface of the portion thinner than said outer lead in said inner lead.

14. The device according to claim 12, further comprising:
   a bus bar connecting two arbitrary ones of said inner leads and extended along end portions of the other inner leads, wherein
   a thickness of at least a portion of said inner lead in contact with said insulating tape in said bus bar is substantially equal to a thickness of the portion thinner than said outer lead.

15. The device according to claim 14, wherein a portion for pressing and bonding said bonding wire is formed on an upper surface of the portion thinner than said outer lead in said inner lead.

16. The device according to claim 14, wherein said bonding wire passes over at least the portion of said bus bar thinner than said outer lead.

17. A resin-encapsulated semiconductor device, comprising:
- a semiconductor chip on which circuits are formed;
- bonding pads formed on said semiconductor chip;
- outer leads for connecting external terminals;
- inner leads connected to said outer leads;
- an insulating tape for electrically insulating said inner leads from said semiconductor chip, said inner leads bonded to a circuit formation surface of said semiconductor chip with said insulating tape interposed therebetween; and
- bonding wires electrically connecting said inner leads and bonding pads, wherein
- an end portion of said inner lead is located downwardly from a portion of said inner lead connected to said outer lead, and a lower surface of the end portion of said inner lead is partially removed to form a notched portion, and
- one surface of said insulating tape is bonded to at least a part of the notched portion of said inner lead and the other surface of said insulating tape is bonded to an upper surface of said semiconductor chip.

18. The device according to claim 17, wherein a portion for pressing and bonding said bonding wire is formed on an upper surface of the notched portion of said inner lead.

19. The device according to claim 17, further comprising:
- a bus bar connecting two arbitrary ones of said inner leads and extended along end portions of the other inner leads, wherein
- a thickness of at least a portion of said bus bar in contact with said insulating tape is substantially equal to a thickness of the notched portion of said inner lead.

20. The device according to claim 19, wherein a portion for pressing and bonding said bonding wire is formed on an upper surface of the notched portion of said inner lead.

21. The device according to claim 19, wherein said bonding wire passes over at least the portion of said bus bar having the same thickness as the notched portion of said inner lead.

22. A resin-encapsulated semiconductor device, comprising:
- a semiconductor chip on which circuits are formed;
- bonding pads formed on said semiconductor chip;
- outer leads for connecting external terminals;
- inner leads connected to said outer leads;
- an insulating tape for electrically insulating said inner leads from said semiconductor chip, said inner leads bonded to a circuit formation surface of said semiconductor chip with said insulating tape interposed therebetween; and
- bonding wires electrically connecting said inner leads and bonding pads, wherein
- an end portion of said inner lead is located downwardly from a portion of said inner lead connected to said outer lead, and a lower surface of the end portion of said inner lead is partially removed to form a recessed portion, and
- one surface of said insulating tape is bonded to at least a part of an inner surface of the recessed portion of said inner lead and the other surface of said insulating tape is bonded to an upper surface of said semiconductor chip.

23. The device according to claim 22, wherein the recessed portion is formed in at least a portion of said inner lead positioned above said semiconductor chip.

24. The device according to claim 22, wherein a portion for pressing and bonding said bonding wire is formed on an upper surface of the recessed portion of said inner lead.

* * * * *